US007049652B2

(12) United States Patent
Mokhlesi et al.

(10) Patent No.: US 7,049,652 B2
(45) Date of Patent: May 23, 2006

(54) PILLAR CELL FLASH MEMORY TECHNOLOGY

(75) Inventors: Nima Mokhlesi, Los Gatos, CA (US); Jeffrey W. Lutze, San Jose, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/732,967

(22) Filed: Dec. 10, 2003

(65) Prior Publication Data

US 2005/0127428 A1 Jun. 16, 2005

(51) Int. Cl.
*H01L 29/788* (2006.01)

(52) U.S. Cl. .................... 257/315; 257/314; 257/316

(58) Field of Classification Search ......... 257/314–320
See application file for complete search history.

(56) References Cited

U.S. PATENT DOCUMENTS

| | | | | |
|---|---|---|---|---|
| 5,051,796 A | * | 9/1991 | Gill | 257/316 |
| 5,071,782 A | * | 12/1991 | Mori | 438/259 |
| 5,095,344 A | | 3/1992 | Harari | |
| 5,270,979 A | | 12/1993 | Harari et al. | |
| 5,278,438 A | * | 1/1994 | Kim et al. | 257/316 |
| 5,380,672 A | | 1/1995 | Yuan et al. | |
| 5,602,987 A | | 2/1997 | Harari et al. | |
| 5,617,351 A | * | 4/1997 | Bertin et al. | 365/185.05 |
| 5,712,180 A | | 1/1998 | Guterman et al. | |
| 5,807,778 A | * | 9/1998 | Lee | 438/257 |
| 5,991,517 A | | 11/1999 | Harari et al. | |
| 6,222,762 B1 | | 4/2001 | Guterman et al. | |
| 6,230,233 B1 | | 5/2001 | Lofgren et al. | |
| 6,232,632 B1 | * | 5/2001 | Liu | 257/315 |
| 6,248,633 B1 | | 6/2001 | Ogura et al. | |
| 6,268,248 B1 | | 7/2001 | Mehrad | |
| 6,429,081 B1 | | 8/2002 | Doong et al. | |
| 6,525,369 B1 | | 2/2003 | Wu | |
| 6,576,537 B1 | * | 6/2003 | Tseng | 438/594 |

FOREIGN PATENT DOCUMENTS

| | | |
|---|---|---|
| DE | 4233790 A1 | 4/1993 |
| DE | 19649410 A1 | 1/1998 |
| WO | WO97/32309 A | 9/1997 |
| WO | WO02/25733 A | 3/2002 |
| WO | WO2095829 A2 | 11/2002 |

OTHER PUBLICATIONS

EPO/ISA, "Communication Relating to the Results of the Partial International Search", mailed in corresponding PCT/US2004/040324 on Apr. 4, 2005, 6 pages.

EPO/ISA, "Notification of Transmittal of the International Search Report and the Written Opinion of the International Searching Authority, or the Declaration", mailed in corresponding PCT/US2004/040324 on May 25, 2005, 16 pages.

* cited by examiner

*Primary Examiner*—Allan R. Wilson
(74) *Attorney, Agent, or Firm*—Parsons Hsue & de Runtz LLP

(57) ABSTRACT

An array of a pillar-type nonvolatile memory cells (803) has each memory cell isolated from adjacent memory cells by a trench (810). Each memory cell is formed by a stacking process layers on a substrate: tunnel oxide layer (815), polysilicon floating gate layer (819), ONO or oxide layer (822), polysilicon control gate layer (825). Many aspects of the process are self-aligned. An array of these memory cells will require less segmentation. Furthermore, the memory cell has enhanced programming characteristics because electrons are directed at a normal or nearly normal angle (843) to the floating gate (819).

24 Claims, 16 Drawing Sheets

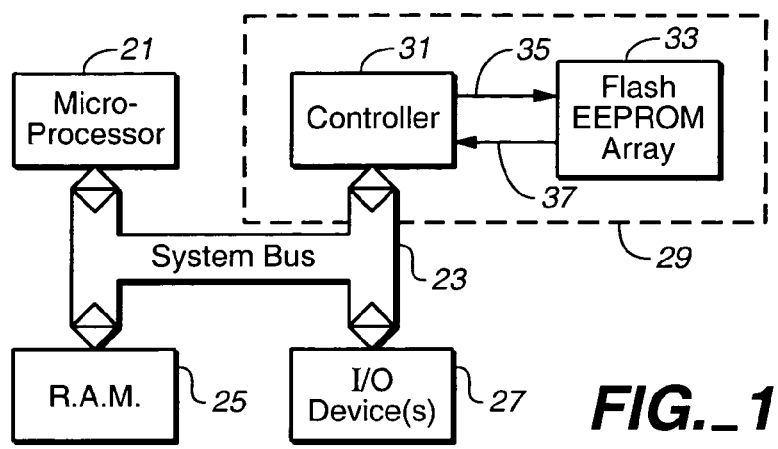
FIG._1
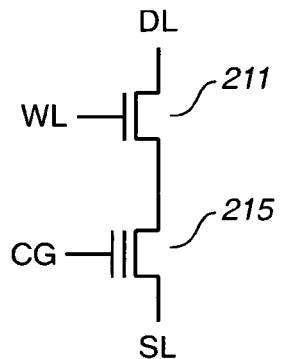
FIG._2
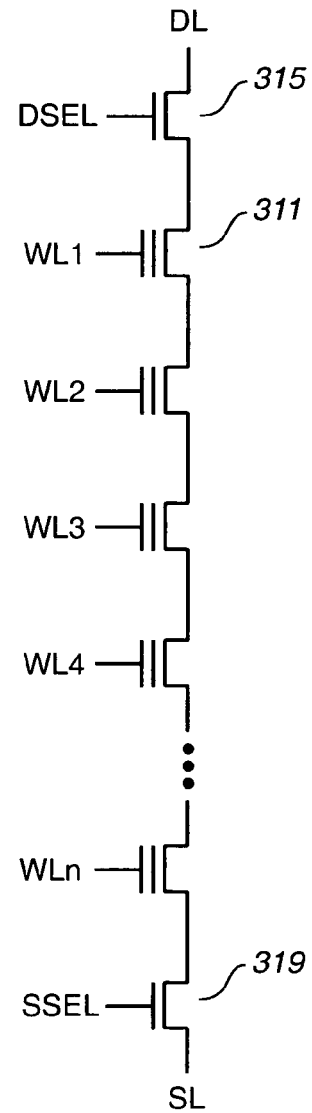
FIG._3

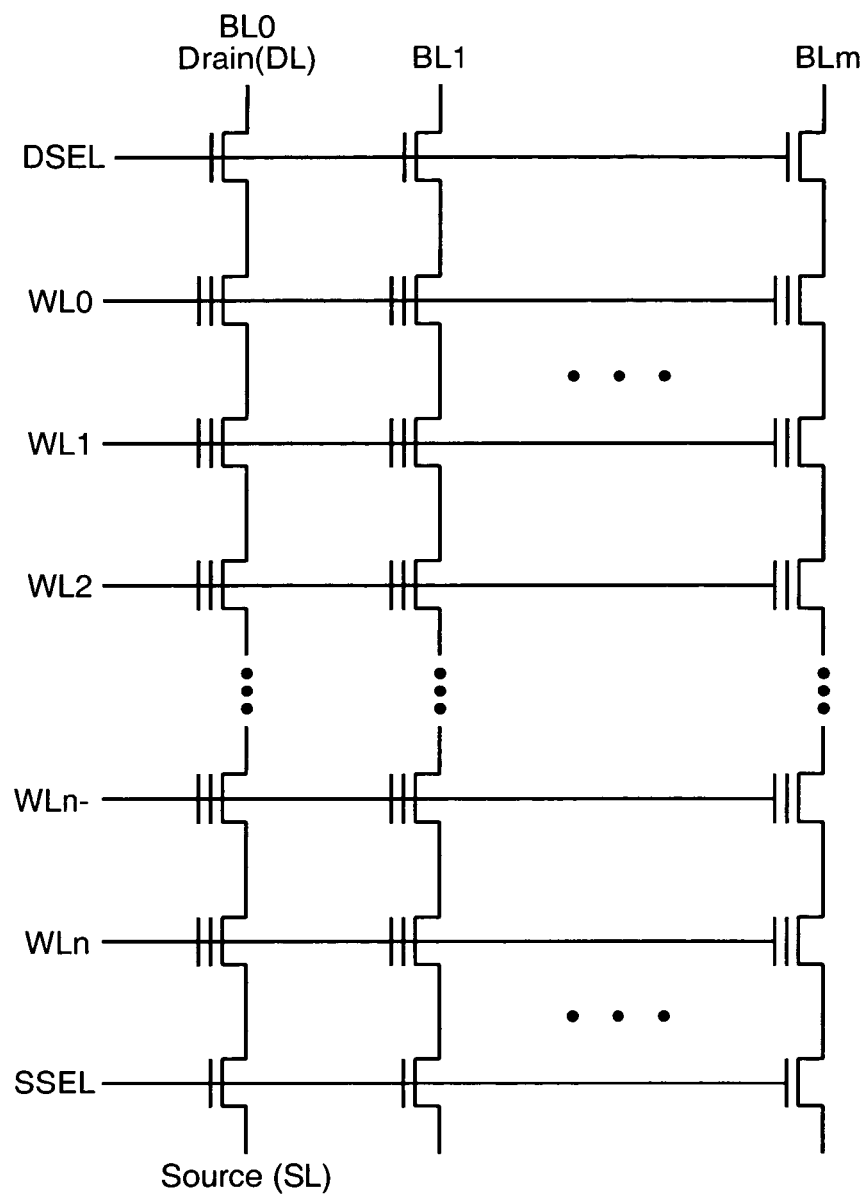
FIG._4
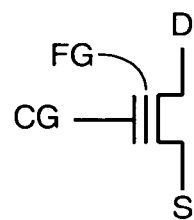
FIG._5

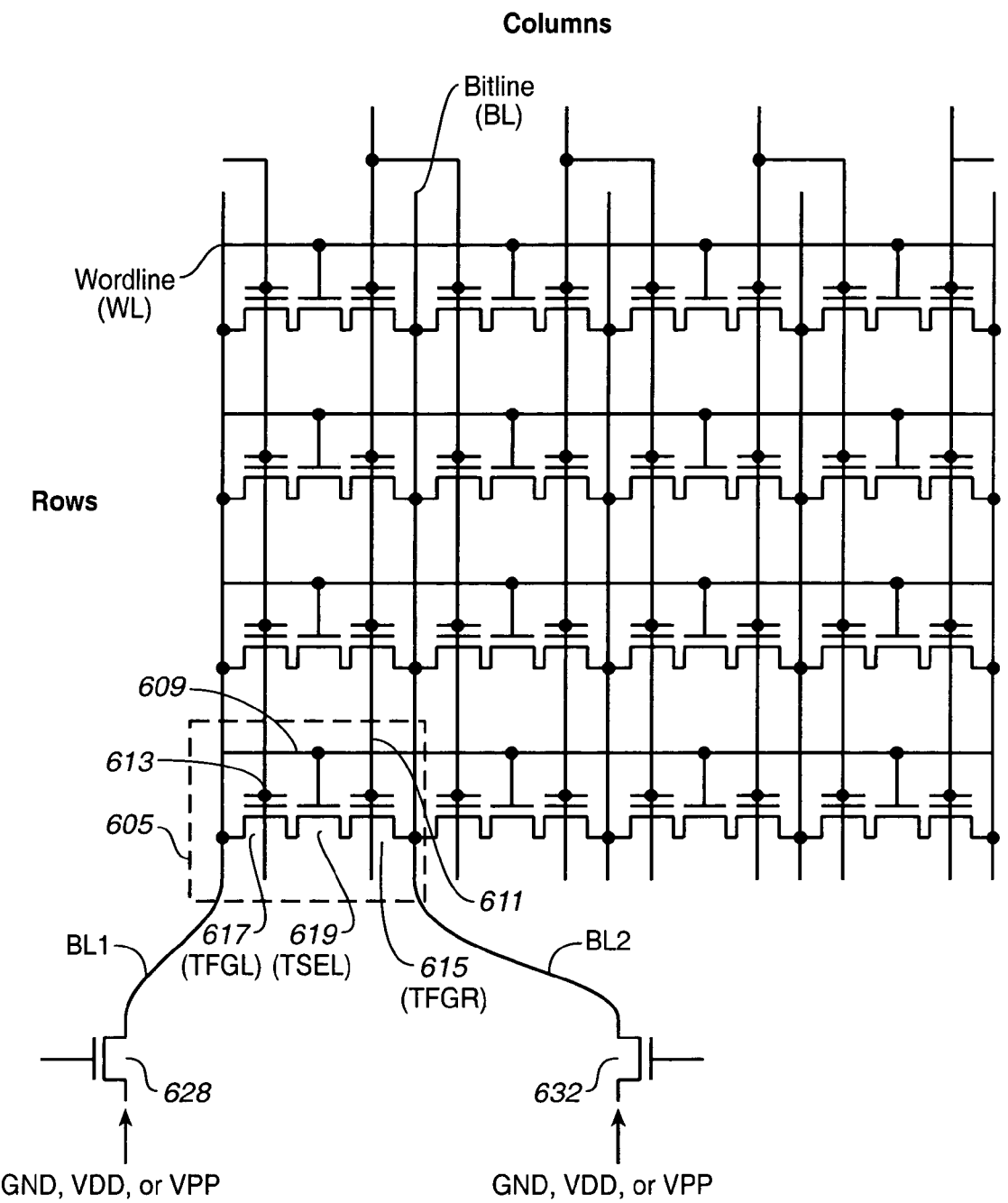
FIG._6

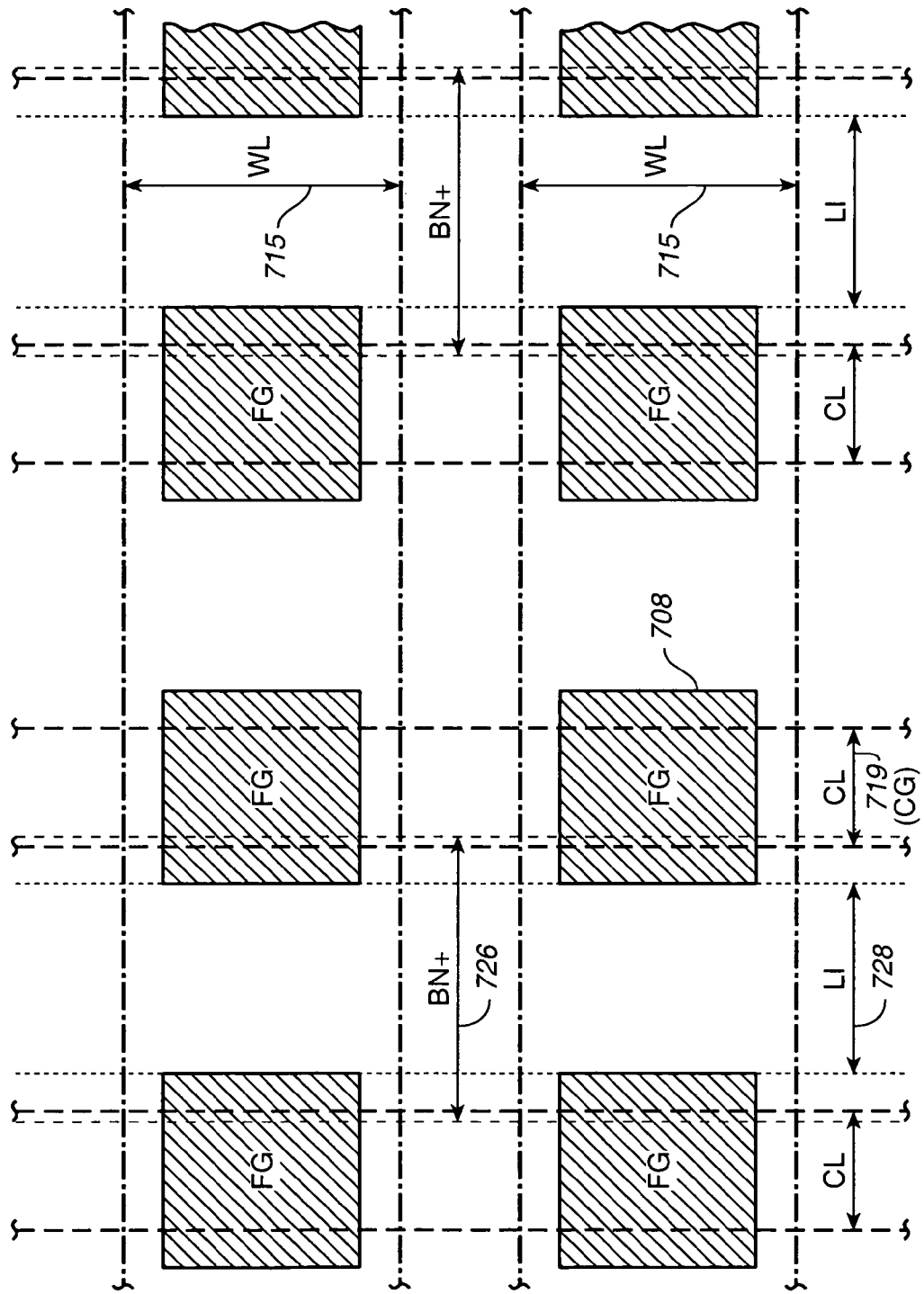
FIG._7

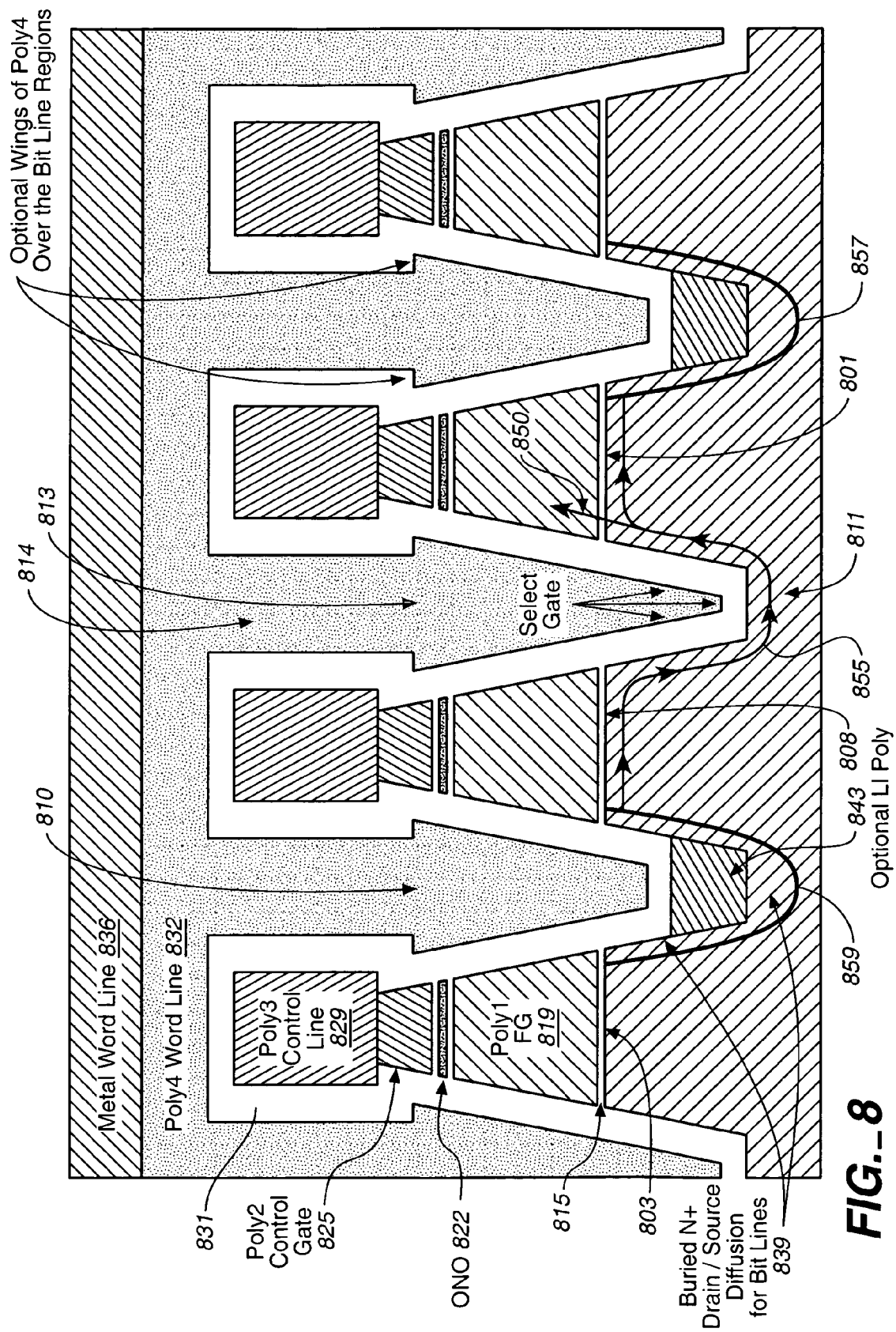
FIG._8

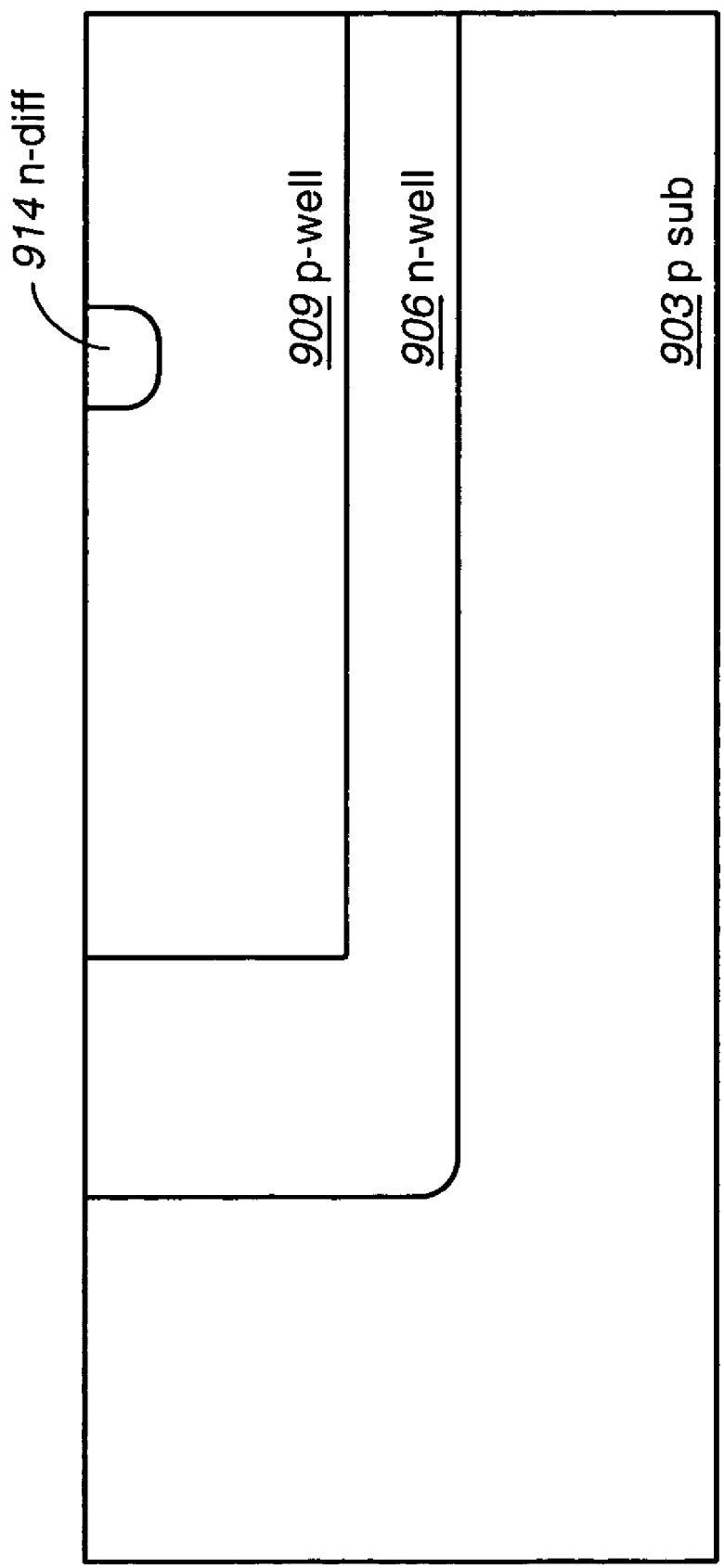
FIG._9

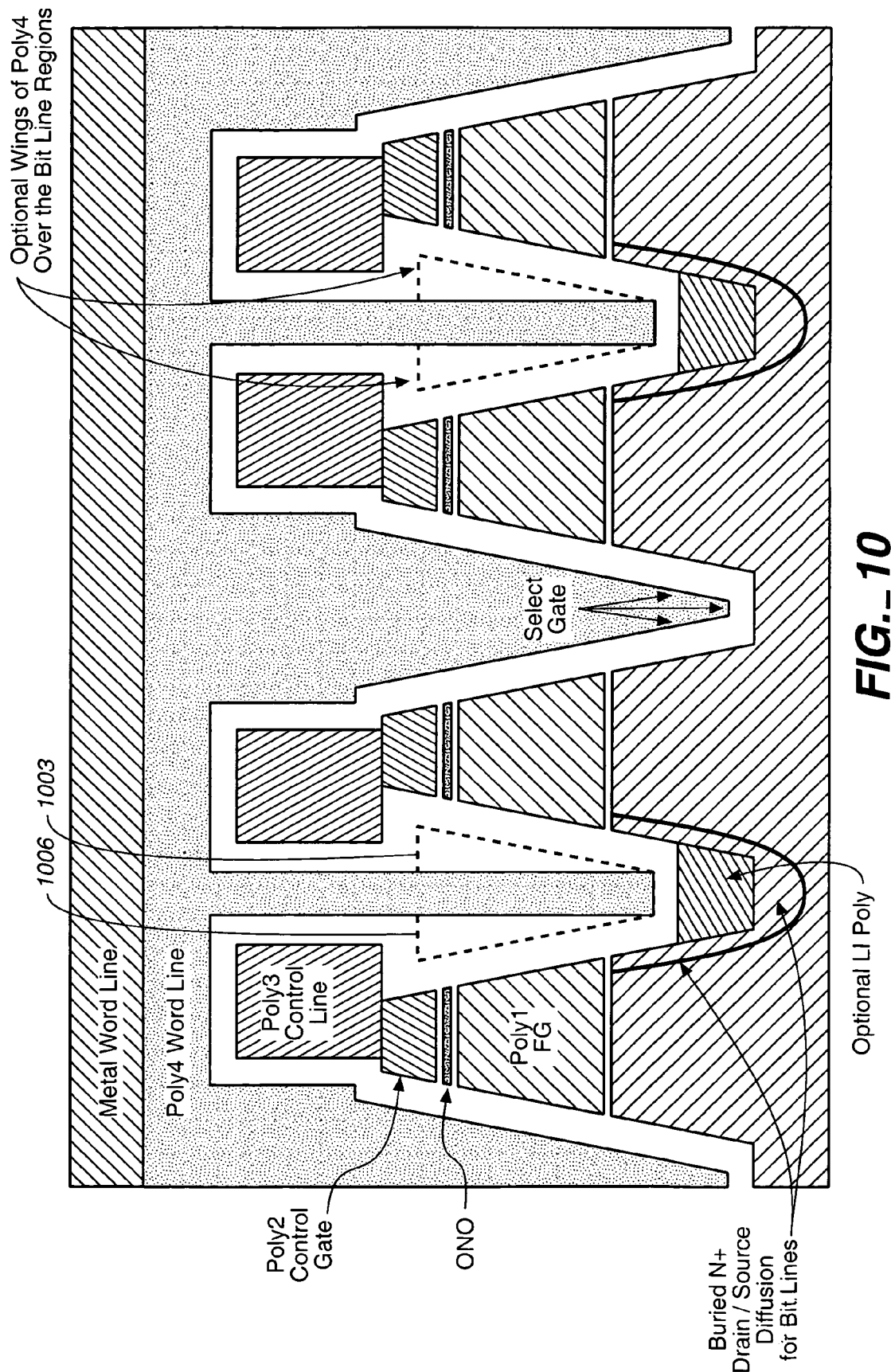

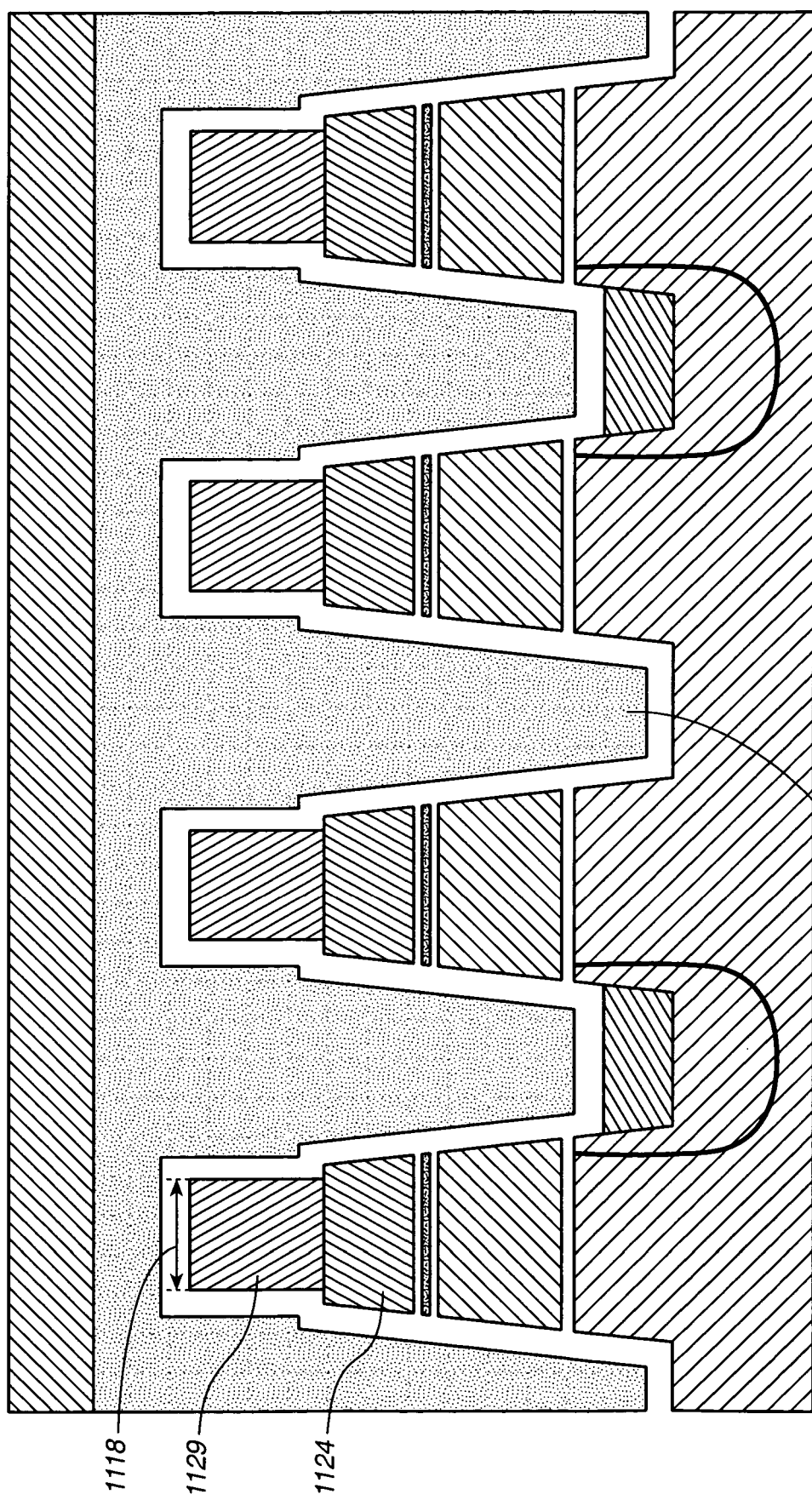
FIG._11

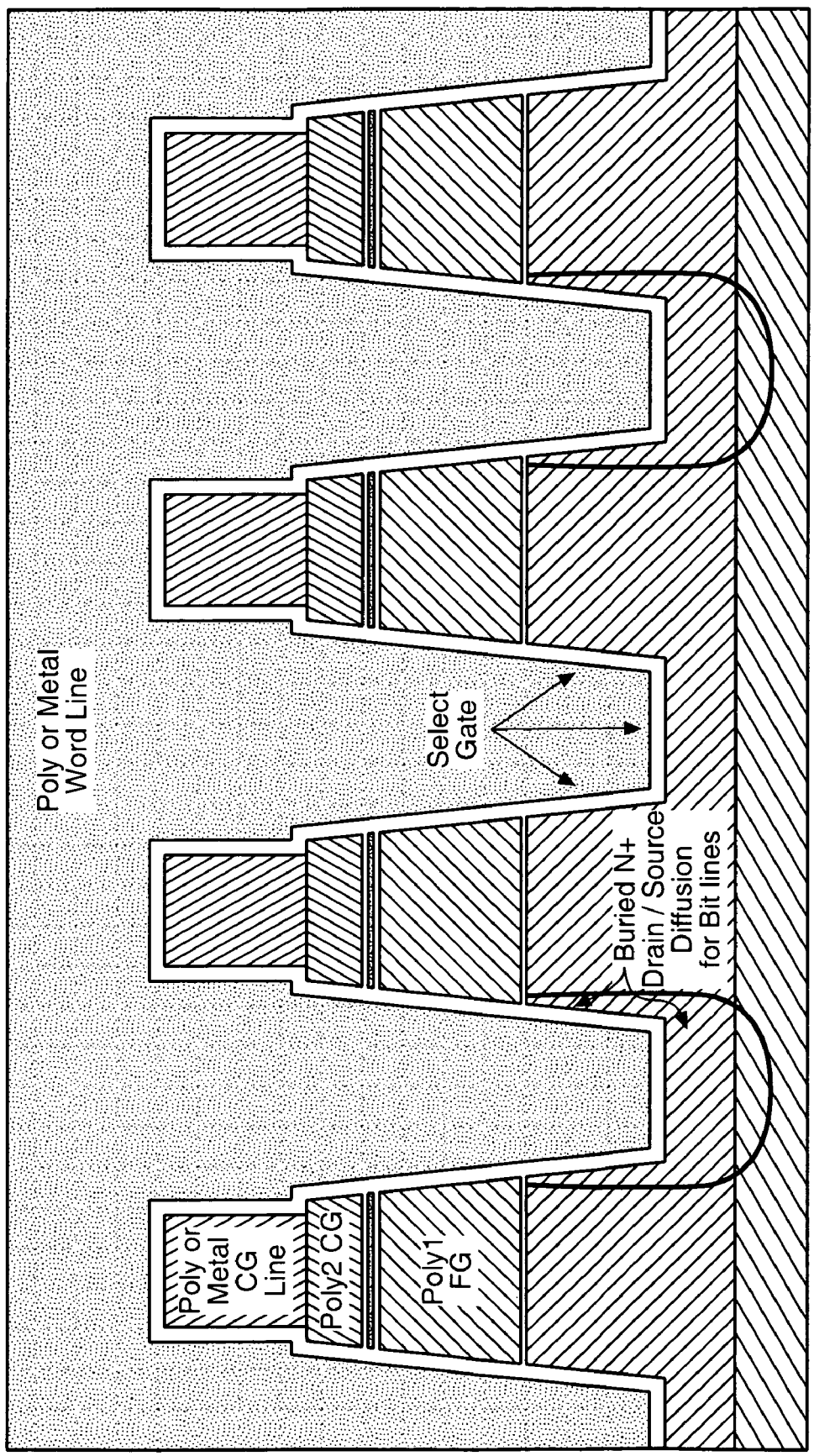
FIG._12

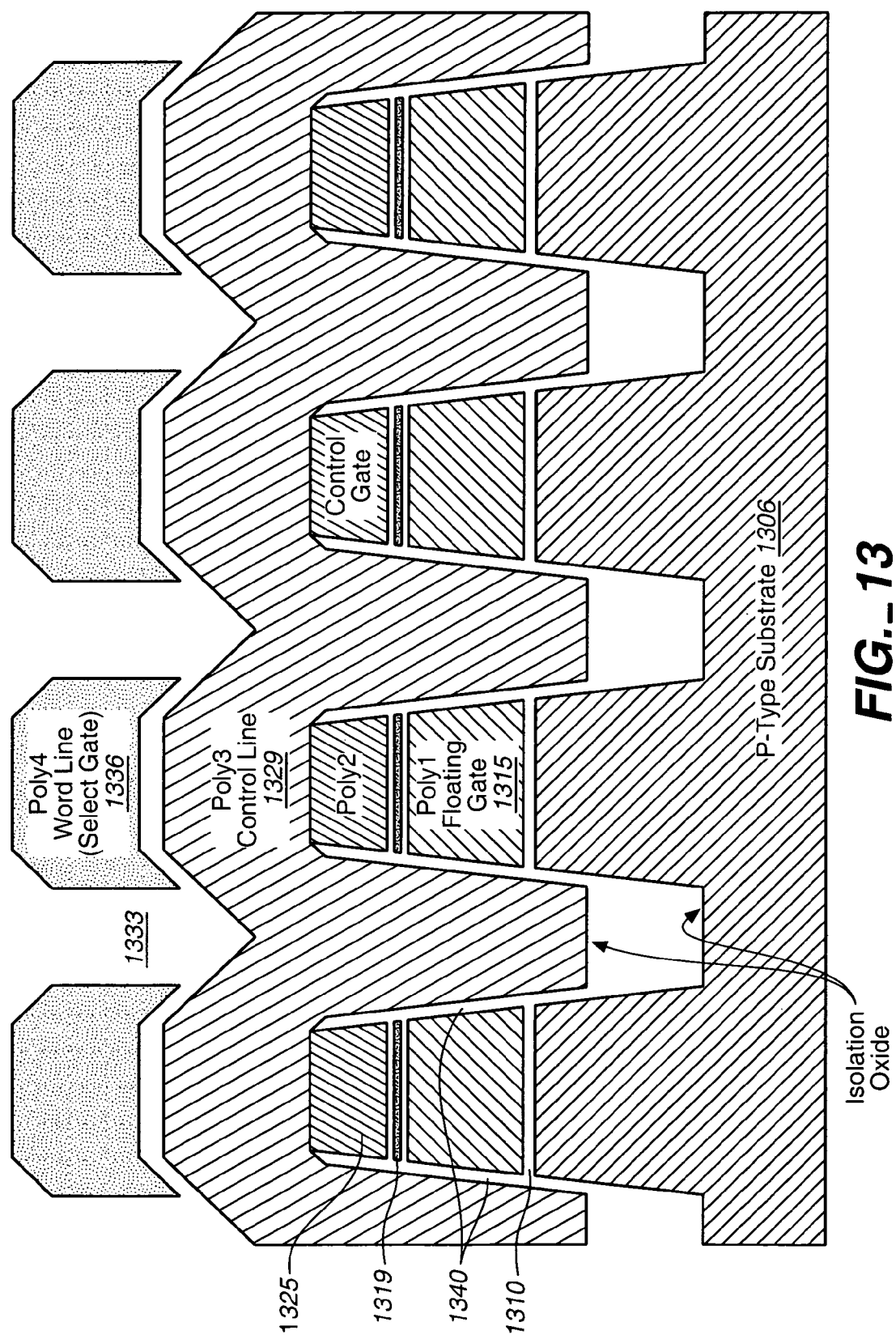
FIG._13

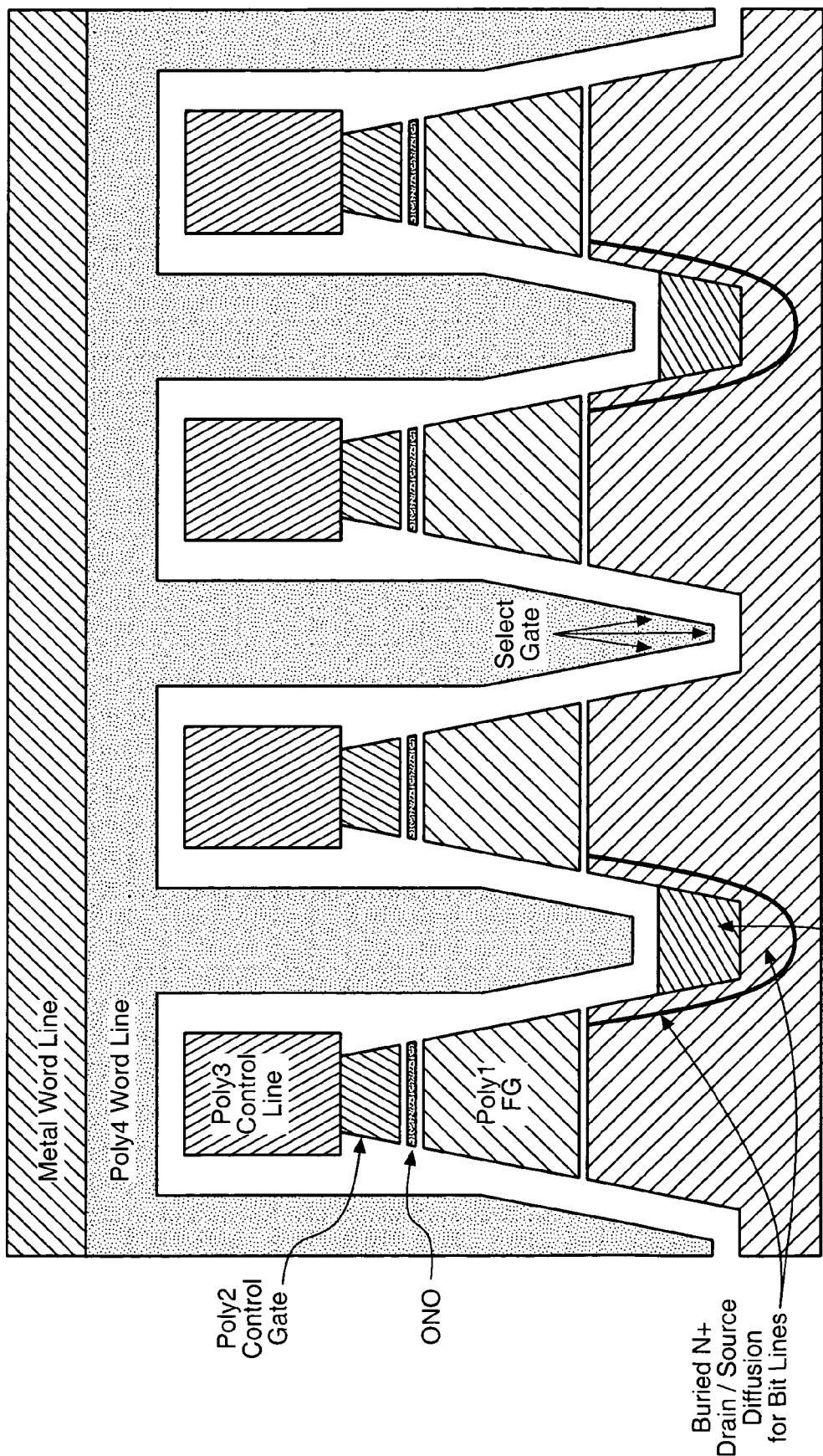
FIG._14

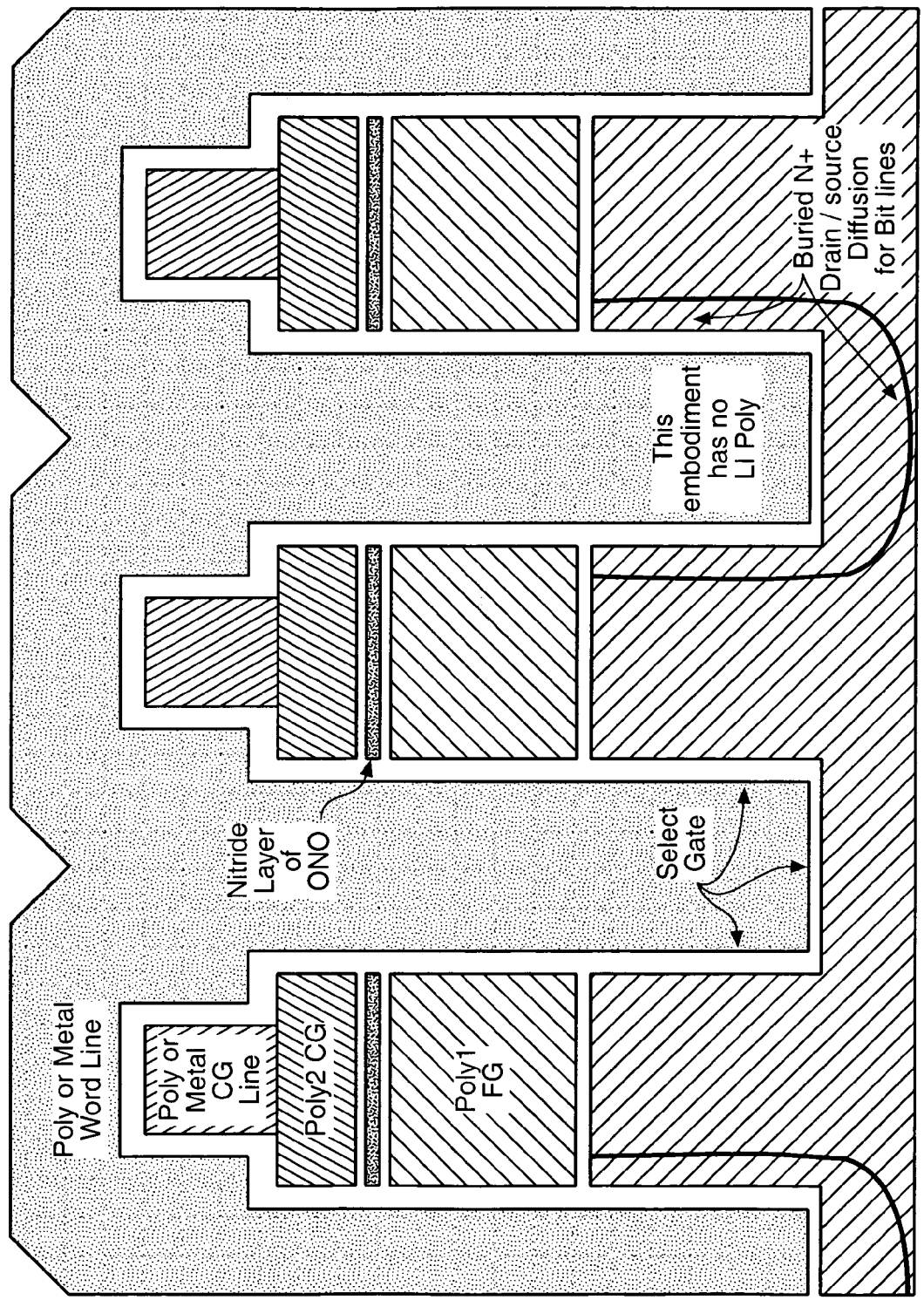
FIG._15

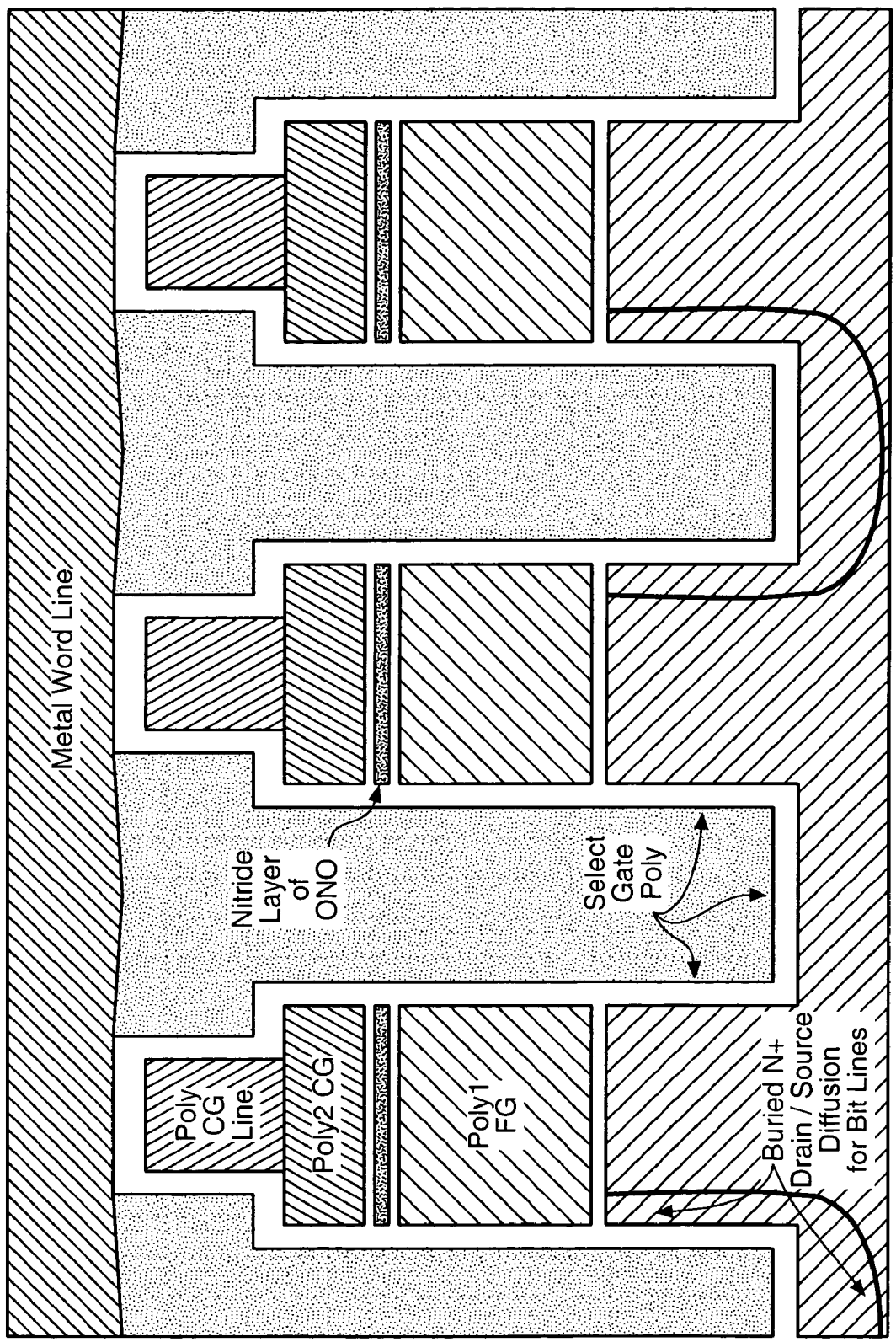
FIG._16

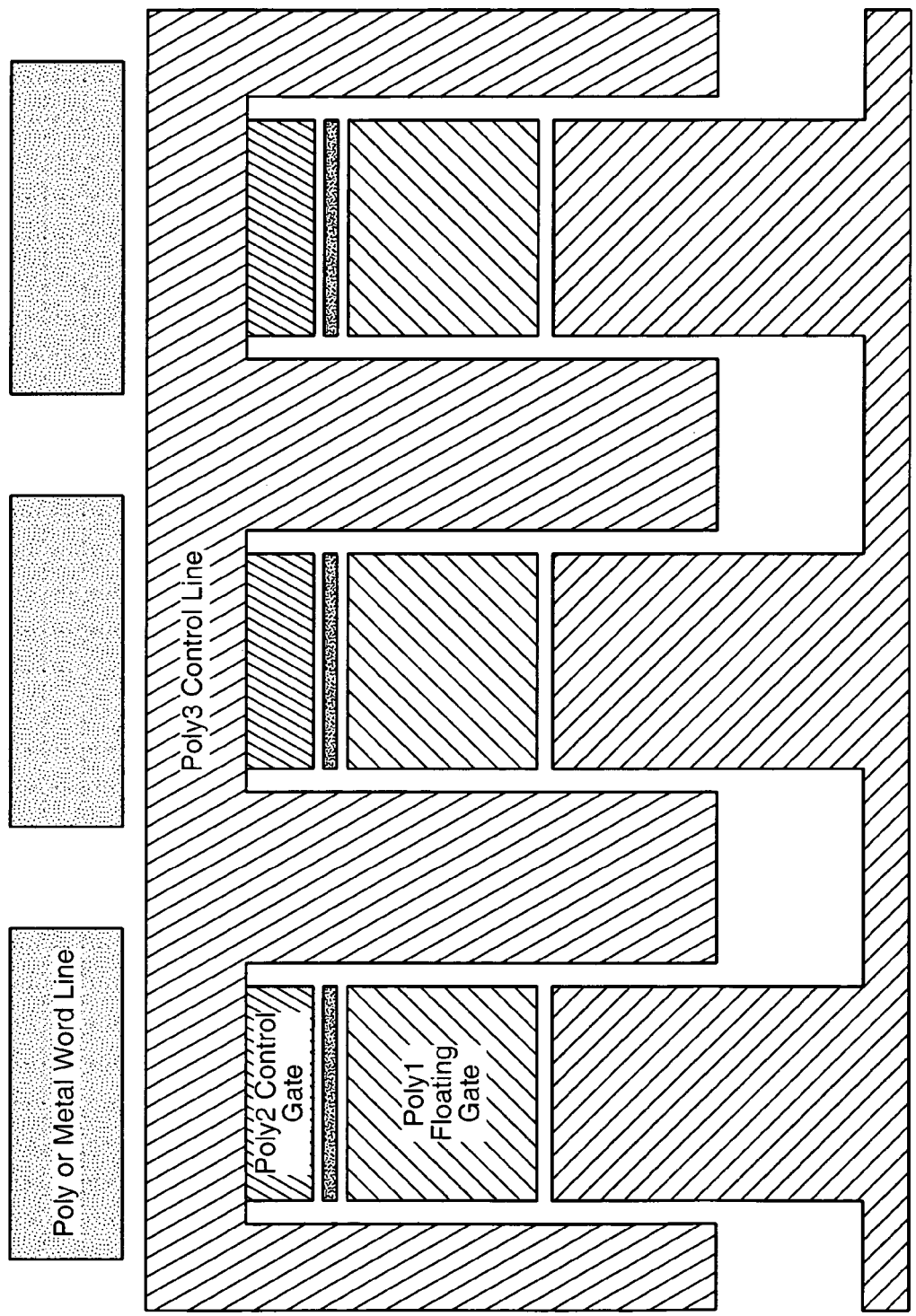
FIG._17

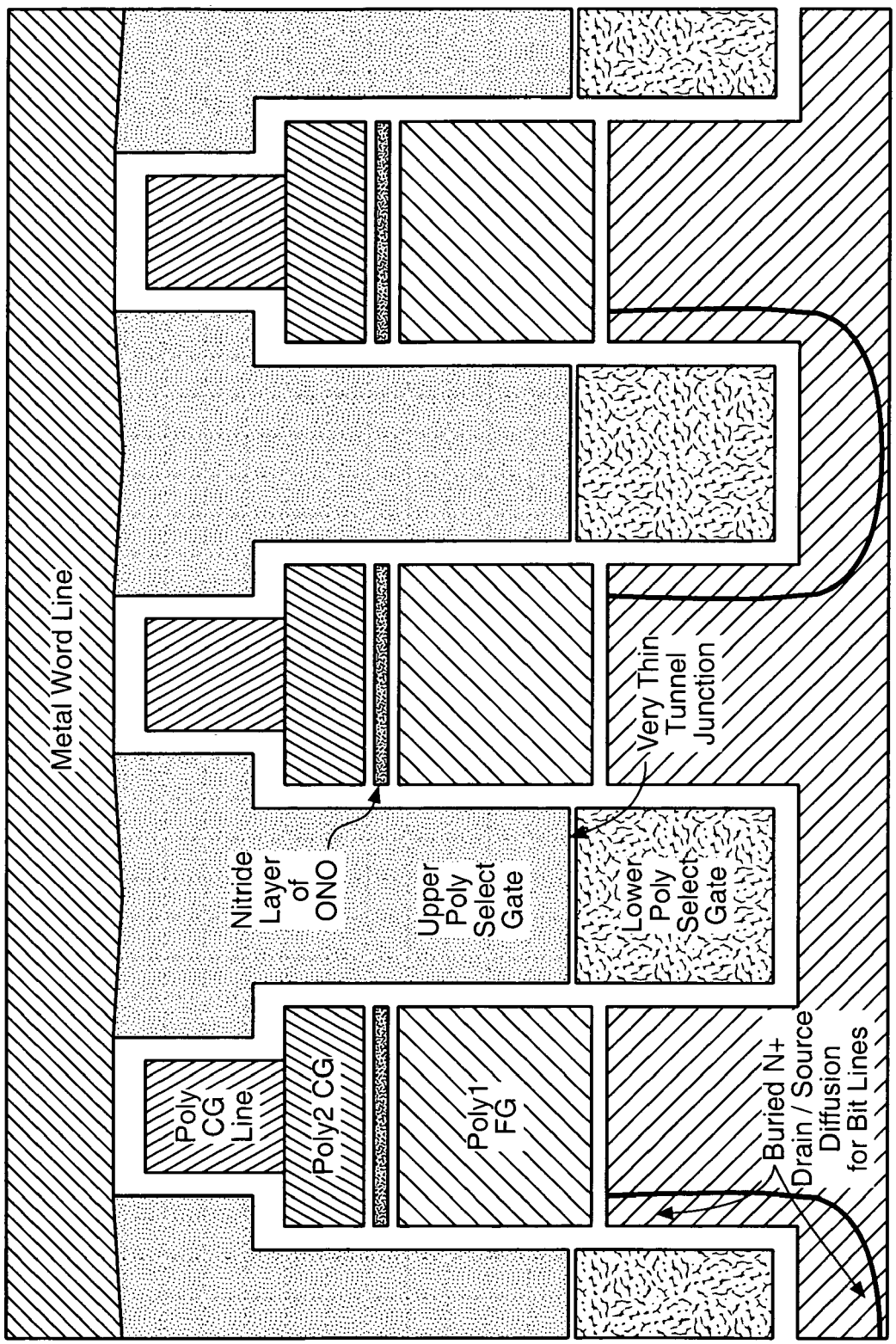
FIG._18

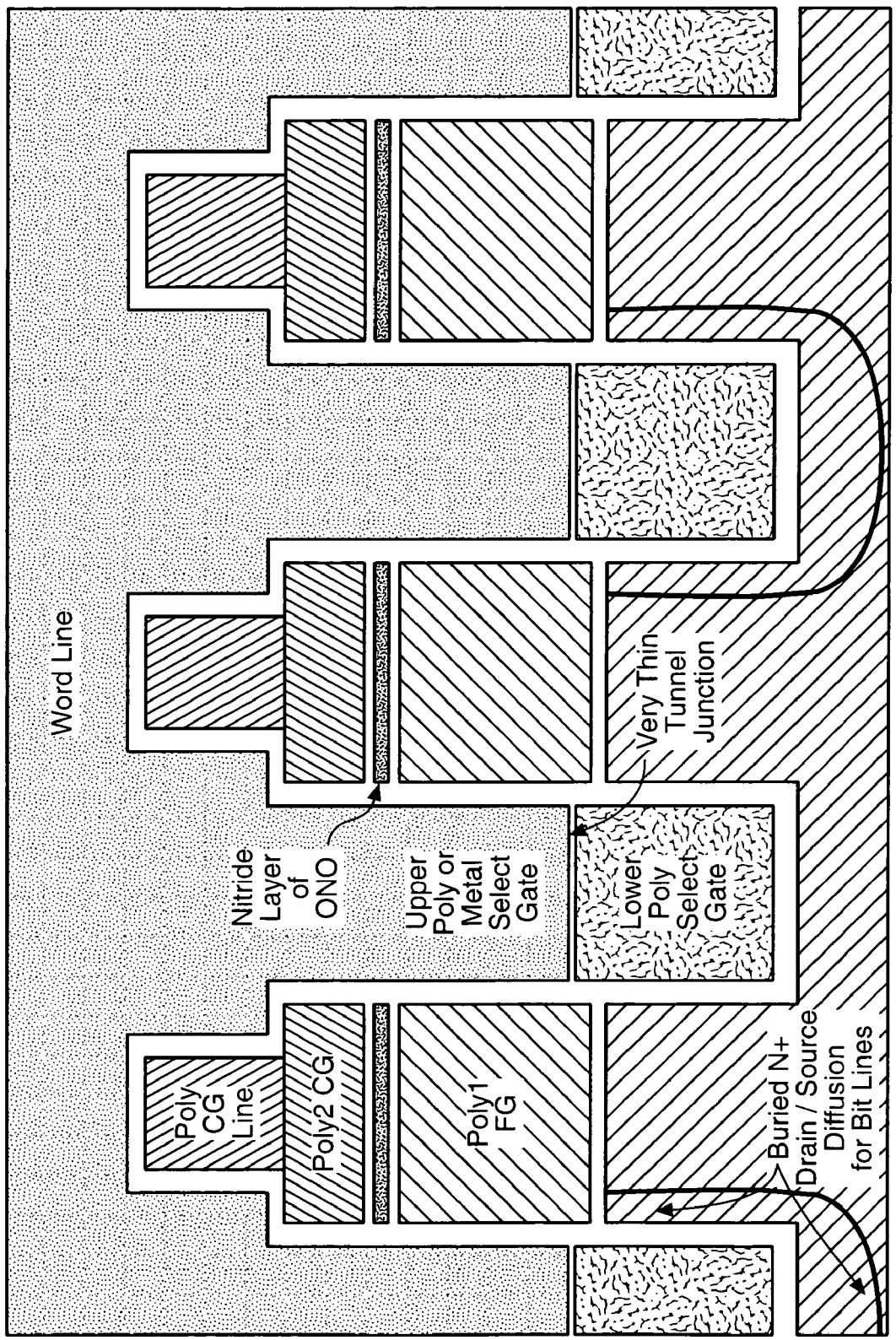
FIG._19

PILLAR CELL FLASH MEMORY TECHNOLOGY

BACKGROUND OF THE INVENTION

The present invention relates to nonvolatile erasable programmable memories and more specifically, structures and fabrication techniques for a pillar structure memory cell storage element.

Memory and storage is one of the key technology areas that is enabling the growth in the information age. With the rapid growth in the Internet, World Wide Web (WWW), wireless phones, personal digital assistants (PDAs), digital cameras, digital camcorders, digital music players, computers, networks, and more, there is continually a need for better memory and storage technology.

A particular type of memory is nonvolatile memory. A nonvolatile memory retains its memory or stored state even when power is removed. Some types of nonvolatile erasable programmable memories include as Flash, EEPROM, EPROM, MRAM, FRAM, ferroelectric, and magnetic memories. Some nonvolatile storage products include CompactFlash (CF) cards, MultiMedia cards (MMC), secure digital (SD) cards, Flash PC cards (e.g., ATA Flash cards), SmartMedia cards, and memory sticks.

A widely used type of semiconductor memory storage element is the Flash memory cell. Some types of floating gate memory cells include Flash, EEPROM, and EPROM. There are other types of memory cell technologies such as those mentioned above. Floating gate memory cells such as Flash are discussed as merely an example. The discussion in this application would also apply to other memory technologies beyond floating gate technology with the appropriate modifications.

Memory cells are configured or programmed to a desired configured state. In particular, electric charge is placed on or removed from the floating gate of a storage element (such as a Flash memory cell) to put the cell into two or more stored states. One state is a programmed state and another state is an erased state. A storage element can be used to represent at least two binary states, a 0 or a 1. A storage element can also store more than two binary states, such as a 00, 01, 10, or 11. This storage element can store multiple states and may be referred to as a multistate, multilevel, or multibit memory cell or storage element. This allows the manufacture of higher density memories without increasing the number of memory cells since each memory cell can represent more than a single bit. The cell may have more than one programmed state. For example, for a memory cell capable of representing two bits, there will be three programmed states and an erased state, for a total of four different states. For a memory cell capable of representing three bits, there will be seven programmed states and an erased state, for a total of eight different states.

Despite the success of nonvolatile memories, there also continues to be a need to improve the technology. It is desirable to improve the density, performance, speed, durability, and reliability of these memories. It is also desirable to reduce power consumption and reduce the cost per bit of storage. If the memory storage element is smaller (i.e., takes less area on the integrated circuit), this will allow greater numbers of storage elements to be fabricated on a single integrated circuit. This will reduce the cost per megabyte or gigabyte. With lower cost storage devices, these devices will be within the means of more consumers around the world, and consumers will be able to purchase greater numbers of storage devices to store their data including audio, pictures, and video.

As can be appreciated, there is a need to improve nonvolatile storage elements by reducing their size and also improving their performance.

SUMMARY OF THE INVENTION

The present invention provides structures and technique for fabricating a pillar-type nonvolatile memory cell, where each memory cell in an array is isolated from adjacent memory cells by a trench. Each memory cell is formed by a stacking process layers on a substrate: tunnel oxide layer, polysilicon floating gate layer, ONO or oxide layer, polysilicon control gate layer, polysilicon control line layer, another oxide layer, and a polysilicon select gate layer. Many steps of the process are self-aligned. Because of the trench isolations along both the bit line and the word line directions, the disturb effects of performing one operation on one memory cell and having that operation disturb adjacent memory cells is reduced. An array of these memory cells will require fewer segmentations, saving up to fifteen percent in die size as compared to a prior implementation. Furthermore, the memory cell has enhanced programming characteristics because electrons are directed at a nearly normal angle to the floating gate.

Nearest neighbor capacitive interference is practically eliminated. Tunnel oxide thickness uniformity has enhanced the cycling endurance. Cross point delivery of programming and erase voltages reduces the associated disturb mechanisms. Single cell erase operation is made possible. Single row erase operation is also possible reducing the erase block size. Higher operating word line voltages will reduce virtual ground array current sneak paths. Floating gate channels are vertical and, therefore not subject to decreasing channel lengths as technology is scaled down.

Note that in a specific embodiment, the ONO layer does not come near the channel. This may help to reduce the effects that charge trap-up (at the oxide-nitride interfaces -and within the nitride layer) may have on memory transistor channel characteristics. Blanket processing may be used all the way to poly-2 deposition. Control gate and control line are in two different layers. Select gate channel may be very long with no area cost. Disturbs are reduced because high voltages are rectangulated to a cell. So some of the burden is carried by the word line and some of it by the control line, and as a result neither will have to go to such extreme voltages as to cause disturbs. Given a targeted cell, cells on the same word line are distinct from cells on the same control line or bit line. Therefore disturb is reduced. High injection efficiency means programming is possible with shorter durations and smaller voltages/currents, and therefore again less disturb. High select-gate VT translates into less disturb. Less disturb, and higher program efficiency means fewer bit line and control line segmentations necessary. Metal word lines (with lower RC time constants), and high coupling of select gate to floating gate means noise can be suppressed by applying AC signals to the word line during read. Since the cells being read are on the same word line, a single AC driven word line will suppress the noise of all the cells in the sector.

In a dual floating gate source side injection (DFGSSI) cell, AC driven select gates would not always reduce noise, and the effective method was to AC drive the control lines, which required thousands of control lines to be driven up and down just to read one sector. The associated (½)CV²*f power consumption would have been prohibitive.

In one aspect, the invention provides a pillar cell Flash memory technology cell with trenched select gates and orthogonal (ballistic injection) source side injection programming.

The invention is a storage element for an integrated circuit including a first and second nonvolatile memory cell. The first nonvolatile memory cell includes a first layer of p-type material, a second layer of oxide, a third layer of polysilicon for a first cell floating gate, a fourth layer of oxide-nitride-oxide (ONO), a fifth layer of polysilicon for a first cell control gate, and a sixth layer of polysilicon or metal conductor. The sixth layer of polysilicon or metal conductor is electrically connected to the first cell control gate.

The second nonvolatile memory cell includes a first layer of p-type material, a second layer of oxide, a third layer of polysilicon for a second cell floating gate, a fourth layer of oxide-nitride-oxide (ONO), a fifth layer of polysilicon for a second cell control gate, and a sixth layer of polysilicon or metal conductor. The sixth layer of polysilicon or metal conductor is electrically connected to the second cell control gate. Furthermore, the first floating gate and the second floating gate may be two floating gates that are on the same word line, and they form a pair of floating gates that are both between two adjacent bit lines.

The invention is a storage element for an integrated circuit including a first and second nonvolatile memory cell. The first nonvolatile memory cell includes a first layer of p-type material, a second layer of oxide, a third layer of polysilicon for a first cell floating gate, a fourth layer of oxide-nitride-oxide, a fifth layer of polysilicon for a first cell control gate, a sixth optional layer of local interconnect polysilicon forming local bit lines, a seventh layer of isolation oxide for trenches between two neighbor floating gates on two neighbor word lines, an eighth layer of polysilicon or metal local control line layer, a ninth oxide layer isolating the control lines from the word lines, a tenth polysilicon or metal select gate (or local word line or global word line) layer, an eleventh layer of insulating material, a twelfth layer of metal conductor for global bit lines, a thirteenth intermetal insulating layer, a fourteenth metal layer for global control lines, an optional fifteenth inter-metal dielectric layer, and an optional fifteenth metal layer for global word lines. The eighth layer of polysilicon or metal conductor is connected (physically coupled) to the first cell control gate. The roles of the twelfth, the fourteenth, and the sixteenth layers can be interchanged in various permutations: for example the twelfth layer can be used for global control lines. Control gates can be referred to as steering gates, and control lines can be referred to as steering lines.

The second nonvolatile memory cell includes essentially the same layers as the first nonvolatile memory. The two etches that form the pillars may be done in reverse order. One cell may be a left cell, and the other cell may be a right cell of a pair of cells on the same word line, and between two adjacent bit lines. Each cell may have its own unique control line. Basically one is the mirror image of the other. Four possible embodiments of the invention are: (1) array with local interconnect (LI) poly and isolation etch performed before bit line/select gate etch, (2) array with LI poly and isolation etch performed after bit line/select gate etch, (3) array with no LI poly and isolation etch performed before bit line/select gate etch, and (4) array with no LI poly and isolation etch performed after bit line/select gate etch. Based on a process flow of the invention, there are many other possible embodiments pertaining to other optional process steps. So let us say that there are 10 such optional steps in the entire process each one of which is a 2 way fork on the road (example1: either we perform some step or we do not) (example 2: x step before y step or y step before x step). With 10 such binary options there will be 1024 embodiments with the understanding that any one wafer will belong to one of these 1024 different embodiments. Generally there will not be a wafer or a chip that has some cells or some areas processed with one embodiment and other cells or areas processed with another embodiment. However, some specific embodiments may be combined with other embodiments in an appropriate situation.

There is a first trench between the layers of first and second nonvolatile memory cells A first sidewall insulator is adjacent the first nonvolatile memory pillar, and a second sidewall insulator is adjacent the second nonvolatile memory pillar. Usually a memory cell consists of that piece of the array that if tiled, or if mirrored and tiled, will form the entire array. With such an understanding each memory cell includes multiple side walls within itself. A seventh layer of insulator covers the first and second nonvolatile memory cells and extends along the first and second sidewalls. The layers of the first and second nonvolatile memory cells are formed horizontally, and the first and second sidewalls are vertical. A select gate is formed between the first and second nonvolatile memory cells and at the bottom of the first trench.

In specific implementations, the first and second nonvolatile memory cells are multistate memory cells, each capable of storing two or more bits of data. An eighth layer of polysilicon covers the first and second nonvolatile memory cells and also fills the trench.

In a further aspect of the invention, there may be a third nonvolatile memory cell of an adjacent storage element including a first layer of p-type material, a second layer of oxide, a third layer of polysilicon for a third cell floating gate, a fourth layer of oxide-nitride-oxide, a fifth layer of polysilicon for a third cell control gate, and a sixth layer of polysilicon or metal conductor, which is electrically connected to the third cell control gate. A second trench is between the layers of first and third nonvolatile memory cells, where a third sidewall is adjacent the first nonvolatile memory cell and a fourth sidewall is adjacent the third nonvolatile memory cell.

An n+ diffusion region is formed at a bottom of the second trench and extends along the third sidewall to the first layer of oxide of the first nonvolatile memory cell and also extends along the fourth sidewall to the first layer of oxide of the third nonvolatile memory cell. There may be a local interconnect polysilicon layer at the bottom of second trench, electrically connecting to the n+ diffusion region. When programming the first nonvolatile memory cell, by taking advantage of the source-side injection phenomenon electrons are directed into the first cell floating gate with an angle of incidence that is nearly normal to the Si/SiO2 interface. The storage cell may be formed in a triple well.

According to another aspect, the invention provides method of fabricating an array of nonvolatile memory cells. A first oxide layer if formed on a substrate material. A first polysilicon layer is formed on the first oxide layer. An oxide-nitride-oxide layer is formed on the first polysilicon layer. A second polysilicon layer is formed on the oxide-nitride-oxide layer. And, strips of trenches in the direction of the word lines of the array are formed. A transistor is formed by the first and second polysilicon layers, and the second polysilicon layer is self-aligned to the first polysilicon layer.

The first oxide layer may be from about 7 nanometers to about 11 nanometers thick. The first polysilicon layer may be implanted with an n-type dopant. For the oxide-nitride layer, the lower oxide layer may be from about 5 nanometers to about 6 nanometers, the nitride layer of from about 5 nanometers to about 10 nanometers, and the upper oxide layer of from about 5 nanometers to about 7 nanometers.

In another aspect, the invention is a nonvolatile memory cell including a first layer of a substrate material, a second layer of tunnel oxide, stacked on the substrate material, and a third layer of polysilicon for a floating gate of the memory cell, stacked on the tunnel oxide. Furthermore, a fourth layer of oxide-nitride-oxide is stacked on the third layer of polysilicon, and a fifth layer of polysilicon for a control gate of the memory cell is stacked on the fourth layer of oxide-nitride-oxide, where a trench is formed on at least two sides of the first, second, third, fourth, and fifth layers. The trench may be from about 400 nanometers to about 800 nanometers into the substrate.

In another aspect, the invention is a nonvolatile memory system including a controller and a memory connected to the controller. The memory includes an array of memory cells, each memory cell isolated from adjacent memory cells by a trench filled with polysilicon. Each memory cell includes a first layer of a substrate material; a second layer of tunnel oxide, stacked on the substrate material; a third layer of polysilicon for a floating gate of the memory cell, stacked on the tunnel oxide; a fourth layer of oxide-nitride-oxide, stacked on the third layer of polysilicon; and a fifth layer of polysilicon for a control gate of the memory cell, stacked on the fourth layer of oxide-nitride-oxide.

In the embodiments of the invention, a p-type substrate can be replaced with n-type substrate, and the n-type source/drain diffusions can be replaced with p-type source/drain diffusions in which case we would have PMOS Flash memory as opposed to the NMOS Flash memory. The carriers and the injected charge will be holes as opposed to electrons.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 generally shows an electronic system in which various aspects of the present invention may be incorporated.

FIG. 2 shows a diagram of a NOR Flash cell.

FIG. 3 shows a diagram of NAND Flash cells.

FIG. 4 shows an array of NAND memory cells.

FIG. 5 shows a floating gate memory cell.

FIG. 6 shows an array of a or dual floating gate source side injection (DFGSSI) flash memory cells.

FIG. 7 shows a layout of storage elements of the invention.

FIG. 8 shows a cross-section across a bit line for an implementation of pillar structure cells, where a cut is made along a word line and across two bit lines of an array of cells.

FIG. 9 shows a triple well structure.

FIG. 10 shows another cross-section along a word line and across two bit lines of pillar structure cells, where for two neighboring cells, every pair of control gate lines that reside on two sides of the same bit line are closer together compared to every pair of control gate lines that reside on two sides of the same select gate.

FIG. 11 shows another cross-section along a word line and across two bit lines of pillar structure cells, where a width of the control gate line is less than a width of the control gate, allowing a misalignment margin equal to half of the control gate width minus control line width.

FIG. 12 shows another cross-section along a word line and across two bit lines of pillar structure cells, similar to FIG. 11, but without local interconnect polysilicon.

FIG. 13 shows a cross-section along the control line and across several word lines for an implementation of pillar structure cells.

FIG. 14 shows a cross-section along a word line and across two bit lines of pillar structure cells for another implementation where the select gate does not widen in the space between two neighbor poly 2 control gates.

FIG. 15 shows a cross-section along a word line and across a bit line for another implementation of pillar structure cells, where the sidewalls of the pillars are vertical and local interconnect polysilicon is not present.

FIG. 16 shows a cross-section along a word line and across a bit line for another implementation of pillar structure cells, similar to FIG. 15, where the gates of the select transistors are composed of one layer of poly, and these isolated select gate pillars are later connected to each other along the direction of word lines to form the word lines using a metal layer.

FIG. 17 shows a cross-section along a control line and across three word lines for another implementation of pillar structure cells.

FIG. 18 shows a vertical trench or pillar wall embodiment of a cell with a thru tunnel junction that separates the lower poly select gate from the upper poly select gate.

FIG. 19 shows an embodiment similar to that in FIG. 18, but the upper poly word line forms a continuous word line that can be reinforced with another metal layer of silicidation.

DETAILED DESCRIPTION

FIG. 1 generally shows an electronic system, such as a computer system, in which various aspects of the present invention may be incorporated. Some examples of electronics systems include computers, laptop computers, handheld computers, palmtop computers, personal digital assistants (PDA), MP3 and other audio players, digital cameras, video cameras, electronic game machines, wireless and wired telephony devices, answering machines, voice recorders, and network routers.

This electronic system architecture includes a processor or microprocessor 21 connected to a system bus 23, along with random access, main system memory 25, and at least one or more input-output devices 27, such as a keyboard, monitor, modem, and the like. Another main computer system component that is connected to a typical computer system bus 23 is an amount of long-term, nonvolatile memory 29. In contrast to volatile memory such as DRAM (dynamic RAM) or SRAM (static RAM), nonvolatile memory retains its stored state even after power is removed from the device. Typically, such a memory is a disk drive using magnetic or optical technology with a capacity of megabytes, gigabytes, or terabytes of data storage. This data is retrieved into the system volatile memory 25 for use in current processing, and can be easily supplemented, changed, or altered.

One aspect of the invention is the substitution of a specific type of semiconductor memory system for the disk drive but without having to sacrifice nonvolatility, ease of erasing and rewriting data into the memory, speed of access, low cost and reliability. This is accomplished by employing an one or more electrically erasable programmable read only memories (e.g., Flash or EEPROMs) integrated circuits. Integrated circuits are sometimes called chips. This type of memory has additional advantages of requiring less power to operate, and of being lighter in weight than a hard-disk drive magnetic media memory, thus being especially suited for battery-operated portable computers. Such nonvolatile semiconductor memories include Flash disk drives, CompactFlash (TM) cards, SmartMedia (TM) cards, personal tags (P-Tag), multimedia cards, secure digital (SD) cards, and memory sticks (R).

The bulk storage memory 29 is constructed of a memory controller 31, connected to the computer system bus 23, and an array 33 of Flash or EEPROM integrated circuit chips. Data and instructions are communicated from the controller 31 to the Flash or EEPROM array 33 primarily over a data line 35. Similarly, data and status signals are communicated from the Flash or EEPROM 33 to the controller 31 over data lines 37. Data lines 35 and 37 may be serial or parallel, depending on the implementation. Other control and status circuits between the controller 31 and the EEPROM array 33 are not shown in FIG. 1.

The nonvolatile memory integrated circuits may also be combined with other integrated circuits or components such as controllers, microprocessors, random access memories (RAM), or I/O devices, to form a nonvolatile memory system. The controller and memory may be on separate integrated circuits or a memory integrated circuit may incorporate the controller. The memory may reside on multiple, separate integrated circuits. For example, multiple memory integrated circuits may be combined to obtain larger memory sizes.

A particular type of nonvolatile memory storage device is the CompactFlash card.

CompactFlash technology has resulted in the introduction of a new class of advanced, small, lightweight, low-power mobile products that significantly increase the productivity and enhance the lifestyle of millions of people.

The concept behind CompactFlash, one of the world's smallest, removable mass storage devices, is to capture, retain and transport data, video, audio and images. CompactFlash provides the capability to easily transfer all types of digital information and software between a large variety of digital systems including portable and desktop computers, handheld PCs (HPCs), personal communicators, Palm PCs, Auto PCs, digital cameras, digital voice recorders, photo printers, and set-top boxes.

CompactFlash is a standard form factor for small, removable, high capacity, mass storage systems. It has found universal acceptance due to its compatibility with industry-standard functionality and electrical connectivity specifications established by the PCMCIA (Personal Computer Memory Card International Association). Data, audio, and images on a CompactFlash memory card are transported to the PCMCIA-ATA (AT Bus Attachment) world of products via a standard PCMCIA Type II adapter card. The 50-pin CompactFlash card, about the size of a matchbook, slides easily into the adapter card. The adapter card has the standard 68-pin PCMCIA interface and can be inserted into any Type II or Type III PC Card ATA slot.

CompactFlash is a storage solution for small form factor systems that need high capacity, removable mass storage with PCMCIA connectivity but are too small to accept a full-size PC Card. Product designers have been unable to develop many of those computing and communications systems thus far partly because no small removable storage device with sufficient capacity existed. CompactFlash is less than one-fourth the size (in volume) of a standard PCMCIA Type II PC card. It weighs approximately a half ounce and is 36 millimeters (1.4 inches) long, 43 millimeters (1.7 inches) wide and 3.3 millimeters (0.13 inches) thick. CompactFlash is available in capacities ranging from 8 to 1024 Megabytes (MB). Greater capacity will become available in the future as technology improves.

CompactFlash is based on nonvolatile technology. Data, audio, video and images are stored on Flash memory chips rather than the conventional, mechanical, rotating disk drives found in most computers. Flash is nonvolatile memory, meaning that once data is saved on the card, it will be retained even if the system's power supply is switched off. Flash is also solid state and has no moving parts. Disk drives have many moving parts and are subject to mechanical problems. Flash is much more rugged and reliable and offers users considerably more protection of data. Mechanical disk drives found in portable computers typically have an operating shock rating of 100 to 200 Gs, which is equivalent to drop of less than a foot. CompactFlash typically has an operating shock rating of 2000 Gs, equivalent to a 10-foot drop to the floor.

CompactFlash cards include a controller that handles all the technology-dependent Flash memory control algorithms. This integrated controller—which stores all IDE (Intelligent Drive Electronics) and ATA commands—makes CompactFlash fully compatible with all computer operating systems, utilities, and application programs that support industry-standard IDE disk drives. Full BIOS and driver support for CompactFlash is already built into numerous platforms and operating systems because they currently support the identical PCMCIA-ATA standard. CompactFlash requires no special Flash file systems or drivers. All file management, error correction code, power management and PCMCIA controller I/O functionality is reduced to a single chip. CompactFlash typically operates on a single supply voltage of 3.3 or 5 volts.

Further discussion of Flash EEPROM systems and nonvolatile cells and storage is discussed in U.S. Pat. Nos. 5,602,987, 5,095,344, 5,270,979, 5,380,672, 5,712,180, 5,991,517, 6,222,762, and 6,230,233, which are incorporated by reference along with all other references cited in this application.

A memory integrated circuit of a nonvolatile memory system will include a number of memory cells, each of which holds at least one bit of data. Multistate memory cells may also be used, which will allow storage of multiple bits of data in each cell. For example, each memory cell may store two, three, four, five, six, seven, eight, or more bits of data per cell. Memory cells capable of storing multiple bits of data may also be referred to as multilevel cells.

Some types of nonvolatile storage elements or memory cells are Flash, EEPROM, and EPROM, which are all floating gate type memory cells. Some aspects of the invention may also be applied to MNOS, SONOS, NROM, FeRAM, and some other types of memories or memory technology.

The memory cells are typically arranged in an array in rows and columns. There may be multiple arrays per integrated circuit. Individual cells are accessed by row and column. Two different organizations for the memory cells are NOR and NAND configurations. The invention is applicable to these configurations as well as other configurations of memory cells.

FIG. 2 shows a nonvolatile memory cell for a NOR configuration. There are many implementation of NOR cells, and this particular implementation is shown merely as an example. In some NOR configurations, there is a select or read transistor 211 connected in series with a memory transistor 215 between a drain line (DL) and source line (SL). The drain line may also sometimes be referred to as a bit line (BL) of the cell. In virtual ground arrays (e.g., the DFGSSI architecture) the source line for one cell can be the drain line for another cell, or the source line of one cell during read can be the drain line of the same cell during programming. The read transistor has a gate connected to a row line (RL) or word line (WL), and the memory transistor has a control gate connected to a control gate (CG) line, control line, or steering line.

Depending on the particular implementation or operation, the drain line and source line may be interchanged or swapped. In particular, the figure shows the drain line is connected to the read transistor and the source line is connected to the memory cell transistor. However, in another implementation or operation, the source line may be connected to the read transistor and the drain line may be connected to the memory cell transistor. For example, if we reserve the word source for that electrode that is at a lower potential than the drain, then during read operations the line that is connected to the drain of the select transistor is the drain line, and the line that is connected to the source of the memory cell transistor is the source line. The situation is reversed for programming, where the higher voltage is applied to the memory cell side to achieve source side injection.

For an array of NOR memory cells, a number of NOR cells will be connected to the drain line (or source line). This will typically be referred to as a column of the array. Each cell of the column will have a separate word line or row line.

In an implementation, both read and memory transistors are n-channel or NMOS type transistors. However, the devices may be other types of transistors including p-channel or PMOS type transistors and others. The read device 211 may be a different device type from the memory device 215 although this is usually very impractical. In a specific implementation, the memory device is a floating gate device such as a Flash, EEPROM, or EPROM transistor. However, the memory device may be another type of device such as a NROM, FeRAM (ferroelectric), MNOS, SONOS or other device.

FIG. 3 shows nonvolatile memory cells in a NAND configuration, or more specifically a single NAND string of cells. In the NAND configuration, there are a number of memory transistors 311 connected in series between a drain select device 315 and a source select device 319, between a drain line (DL) and source (SL). This is a column of memory cells, and multiple columns of these cells may be used to form an array of NAND memory cells. The column of memory cells is sometimes referred to as a NAND chain or string. In a specific implementation, there are at least sixteen memory cells in a NAND chain. Each memory transistor has a gate connected to an individual word line (WL). The word lines may be labeled WL1 to WLn, where n is the number of memory cells in a particular column. The drain select device has a gate connected to a drain select line (DSEL), and the source select device has a gate connected to a source select line (SSEL). Depending on the particular implementation, the drain line and source line may be interchanged or swapped.

In an implementation, the source select transistor, drain select transistor, and memory transistors are n-channel or NMOS type transistors. However, the devices may be other types of transistors including p-channel or PMOS type transistors and others, although there may be relatively large area penalty for doing this. In a specific implementation, the memory device is a floating gate device such as a Flash, EEPROM, or EPROM transistor. However, the memory device may be another type of device such as a NROM, FeRAM, MNOS, SONOS, or other device.

FIG. 4 shows an array of NAND memory cells. There are n rows and m columns of memory cells, where n and m are positive integers. Each column has n memory cells connected to word lines WL0 to WLn. The columns of memory cells are labeled BL0 to BLn. Each column has n memory cells, which are connected between a drain select device and a source select device. And, the drain and source select devices are in turn connected to the drain line (DL) or bit line (BL) and the source line (SL). Gates of the drain select device are connected to the drain select line (DSEL) and gates of the source select device are connected to the source select line (SSEL). A particular cell or selected cell may be accessed by using the appropriate word line and bit line, and applying the appropriate voltages to those lines.

FIG. 5 shows a representative floating gate nonvolatile memory device, which may be used in any of the previously described memory cells and arrays. Further description of floating gate devices may be found in U.S. Pat. No. 5,991,517. The floating memory cell has a drain (D), source (S), control gate (CG), and floating gate (FG).

In brief, a nonvolatile memory cell is one that retains its stored state, even when power is removed. Some examples of floating gate type memory cells include Flash, EEPROM (also known as E2 or E-squared), and EPROM. A Flash and EEPROM cell is electrically erasable and electrically programmable. An EPROM cell is electrically programmable, and erasable using ultraviolet (UV) light. A floating gate device is programmed or erased by subjecting appropriate nodes to high voltages. These high voltages cause electrons to be added to or removed from the floating gate, which will adjust the threshold voltage or VT of the floating gate device. Some physical mechanisms for causing electrons to move to or from floating gate are hot electrons injection or Fowler-Nordheim tunneling.

High voltages, positive or negative, are used to program and erase the memory cells. For binary cells, cells that can be programmed to store a 0 or a 1, generally single voltages are used to program and erase. These voltages may be called VPP (for program) and VEE (for erase).

For multistate programming and erase the control gate programming voltage is stair cased from pulse to pulse, the erase voltage may be a different DAC driven value individually tailored for each sector. In multistate products VPP and VEE voltages may be used to refer to outputs of the medium voltage, and high voltage pumps, respectively. These voltages may not be directly applied to any terminal of a Flash cell. These voltages are used as power sources to generate more precisely controlled DAC voltages that are then delivered to terminals of the memory cells.

The floating gate nonvolatile memory device may store a single bit (0 or 1) or multiple bits (e.g., two bits: 00, 01, 10, and 11, or three bits: 000, 001, 010, 011, 100, 101, 110, and 111, or four bits: 0000, 0001, 0010, 0011, 0100, 0101, 0110, 0111, 1000, 1001, 1010, 1011, 1100, 1101, 1110, and 1111). U.S. Pat. No. 5,991,517 discusses further some aspects of single bit and multibit cells. In short, the memory cell will have an erased state and one or more programmed states.

The coupling ratio of node A to node B is defined as the ratio of the capacitance between the two nodes to the total capacitance as seen from node B to all possible nodes including node A, and is always less than 1. An erased state is when the VT of the device is such that it is turns on at a control gate voltage which is typically less than zero. In other words, erase refers to removing electrons from the floating gate forcing the floating gate device to have a VT (threshold voltage as measured from the control gate) of, for example, 0 volts or below. When erased, the floating gate transistor does conduct current even when 1 volt is placed on its gate (i.e., control gate). Recovery from erase (i.e. soft programming) is the operation consisting of a mandatory programming sequence which gently programs every cell that has been erased to a small positive VT which is typically greater than 0 volts and less than 1 volt. Erase recovery is performed on every cell in an erase block immediately after the block has been erased. All cells are recovered independent of the data state that they will be programmed into at some point in the future. Even those cells that will be programmed to state 0 will be recovered. The reason for performing the erase recovery operation is to reduce or eliminate current sneak paths that may be present in an unrecovered memory array. All the floating gate cells of an integrated circuit may be initialized to an erase recovered state. Furthermore, in an embodiment, the memory cell may need to be erased and recovered before it can be programmed.

Erasing occurs by removing electrons from the floating gate of the floating gate transistor. Erase may also be done by removing electrons from the floating gate and placing them in the channel, the source, the drain, the channel and the source and the drain, the word line (select gate). Only a brief description of various erase and programming schemes are discussed in this patent application since many techniques have been presented elsewhere, and any of these techniques may be applied or used with the present invention. In the case of the pillar cell, it will be more appropriate to erase through the channel, so as to minimize the charge fluence (i.e., electrons transported through the oxide per unit area with units of Coulombs/cm$^2$) in the oxide.

Alternatively electrons can be removed through the bit line. This option requires lower voltages since the bit line to floating gate coupling ratio is smaller than the channel to floating gate coupling ratio. However, the oxide area is smaller and as a result the fluence of charge through the oxide will be higher, moreover the erase distribution will be larger for statistical reasons.

For the pillar cell, erase into the select gate is unattractive because the intent is to increase the select gate coupling ratio, and a high coupling ratio is counter productive to an efficient erase, because with high coupling between two electrodes their voltages tend to track one another which is contrary to creating a large potential difference between the two electrodes in order to obtain substantial tunneling rates. Generally, erasing occurs by the electrons tunneling out of the floating gate. The time it takes to erase the device depends on the magnitude of the electric field at the point where electrons are injected from the floating gate into the insulator that separates the floating gates from the erase electrode, be it the channel, the drain, the source, the select gate, or the control gate. Usually the bottleneck for tunneling current is at the triangular energy barrier which is created at the floating gate tunnel insulator (tunnel oxide) interface. Increased tunnel insulator electric field will further narrow the triangular barrier making increasing amounts of tunneling current possible. The electric field is intensified by producing a larger voltage difference between the floating gate and the erase electrode. This voltage difference depends on the voltage value of the erase electrode, and the voltage of the floating gate. The voltage of the floating gate depends on the charge on the floating gate, and the voltages, and coupling strengths of all the electrodes which capacitively couple to it. Any combination of the following techniques can be used to enhance this voltage difference: (1) higher voltage on the erase gate, (2) lower (including negative values) on any or all other electrodes that have a capacitive coupling to the floating gate, and (3) asperities or texture in the interface between the floating gate, and the insulator which separates the floating gate from the erase electrode (these asperities can locally intensify the tunneling electric field by as much as a factor of 5).

When storing only one bit, the floating gate device will have in addition to the erased state, only one programmed state. For purposes of this application, a programmed state for a single bit cell is typically when the VT of the device is higher than a designated positive value.

For a multistate cell, the VT is set in a specific voltage range indicating it is in a particular state. In other words, depending on what the programmed VT state is, this will indicate a particular stored binary value. For an example of a two-bit memory cell, a VT of 1 volt, or less may indicate a state 0 (binary 00). A VT higher than 1 volt, and less than 2 volts, may indicate a state 1 (binary 01). A VT higher than 2 volts, and lower than 3 volts, may indicate a state 2 (binary 11 with gray coding). And a VT higher than 3 volts, may indicate a state 3 binary 10). In a specific embodiment, gray coding (00, 01, 11, 10) is used so that as we go from state to state only one bit changes at a time.

Programming occurs by adding electrons to the floating gate of the floating gate transistor. A brief description of programming mechanisms and techniques follows. One programming mechanism is tunneling and another is hot electron injection, which are both relatively complex mechanisms. For multistate programming, according to one specific technique, each write operations consists of a sequence of program pulses, each of which is followed by a verify operation.

Typically the control gate voltage during each programming pulses rises to a higher level than the control gate voltage during the preceding pulse. To increase performance, the first set of pulses may have large step sizes, where a step is the difference between the peak voltage of one pulse and the peak voltage of the preceding pulse. The first set of pulses comprise the coarse programming phase. The fine programming phase may start with a step backed first fine programming pulse as compared to the last coarse programming pulse, and the fine programming step size will be substantially smaller than the coarse programming step size.

The verify level is the voltage applied to the control gate during each verify phase. In one embodiment the array architecture is designed to allow control lines of cells that are on the same row and that belong to the same sector (programming block) to simultaneously and independently be driven to various voltages as dictated by the present VT, the target VT, and the programming characteristics of each cell. This embodiment can be referred to as Cell-by-Cell Conditional Steering Architecture or CCCSA. The CCCSA can also be exploited to perform binary searches during read operations as described in U.S. Pat. No. 6,222,762 which is incorporated by reference. The ability to perform parallel binary searches on cell-by-cell basis for the VT of each cell will substantially increase read performance as the number of states per cell increase to 8, or 16. An alternative embodiment to the CCCSA is the conventional Commonly Driven Steering Architecture or CDSA where the steering lines of all cells that belong to the same sector are tied to each other. With CDSA searches for the VT the cells in a sector will have to be performed in a sequential manner where one voltage at a time is applied to the control lines of all cells in the sector, and for the next measurement another voltage is applied, and so on. Employing CDSA in a 4 bits per cell (16 states per cell) embodiment, fifteen sequential sub-read operations have to be performed just to find out the state of each cell without any information about the marginality of the cell VT's. The coarse programming verify voltage is smaller than the fine programming verify voltage, so that given the large step size during coarse programming we do not over shoot the final VT target. The fine programming's verify voltage depends on the state to which the cell is to be programmed to or in other words is data dependent. Every cell that reaches its fine programming verify voltage is locked out of programming by discontinuing the delivery of the control gate and/or the bit line voltage, or by raising the cell's programming source voltage to a high enough voltage to inhibit additional programming by taking advantage of the body effect, and the reduced drain to source voltage.

Channel hot electron injection requires both hot electron production and hot electron injection. To produce hot electrons a large lateral field is required. This is provided by a high drain to source voltage. To inject the hot electrons onto the floating gate a large vertical field is required. This is provided by the control gate voltage which in turn couples some of its voltage to the floating gate. In drain side injection the high vertical field needed for hot electron injection has the side effect of reducing the high lateral field needed for hot electron production. Source side injection does not suffer from the same dilemma, and therefore is more efficient. In both source side injection and drain side injection, a scattering mechanism is required to divert the momentum of electrons traveling laterally through the channel, so that a lucky few will be scattered vertically towards the floating gate.

The normal hot electron impingement that is an innovative feature of this cell, may increase the programming efficiency beyond the improved efficiency of source side injection because the majority of hot electrons will have a momentum that will aid them in surmounting the Si/SiO2 energy barrier. It will no longer be necessary for the hot electrons to scatter into a direction that would aid them in surmounting the Si/SiO2 energy barrier. Normal hot electron impingement has been referred to as ballistic injection in U.S. Pat. No. 6,248,633 where through the introduction of extra complexity into the process flow, an extra protrusion has been added to the a spacer floating gate (See FIG. 5 A, B, C of U.S. Pat. No. 6,248,633) in order provide for ballistic injection in a non-preferred embodiment of that patent. It should be noted that such a protrusion can act as an asperity which by intensifying the local electric fields at its sharp edge can hasten the charge loss from the floating gate. This can exacerbate read disturb, write disturb, and charge retention problems.

Another mechanism for programming would be Fowler-Nordheim tunneling, as is used in the NAND technology. But to use tunneling entails giving up the potential benefits of the previously discussed mechanism. Tunneling is generally very slow in comparison to hot electron injection. In the case of tunneling, performance has to be maintained by programming larger numbers of cells in parallel at a cost of larger numbers of peripheral programming blocks. So the preferred method of programming for the pillar cell would be source side normal impingement of hot electrons.

During each programming pulse the drain voltage is maintained at a constant value in the range 3 volts to 6 volts. The control gate voltage for the first programming pulse will have some positive starting value that has to be characterized, and may be adaptively determined even in the field. The transfer gate voltage is a constant envisioned to be in the range 6 volts to 10 volts. The select gate or word line voltage is envisioned to be in the range 3 volts to 10 volts. The select transistor's threshold voltage would ideally be as high as possible so that the operating select gate voltage is as high as possible. This is because the optimum select gate voltage for the most efficient source side injection is less than a volt higher that the select gate threshold voltage. As in the case of DFGSSI cell, the drain for programming will be the bit line just adjacent the cell, and the source for programming will be the neighbor bit line residing on the other side of the select gate that pertains to the floating gate of interest. It should be noted that, in a specific embodiment, the roles of the two bit lines reverses for the read or verify operation where the adjacent bit line to the floating gate is the source. In this naming convention source is always that electrode with a lower voltage as compared to the drain. The source voltage for programming may be adaptively controlled by a current limiter such that the instantaneous programming current will not exceed some designated value.

The movement of charge into and out of the floating gate is determined by electric field magnitude across the tunneling dielectric (which is the gate oxide between the floating gate and channel region): the higher the voltage difference between the control gate or the floating gate and the source, the higher the charge transfer into the floating gate. The time it takes to program the device depends on various factors including the programming control gate voltage. Generally, the greater the control gate voltage or stronger the electric field, the faster the device will become programmed. In a specific embodiment, the voltages applied to the cell terminals are DAC (digital-to-analog converter) controlled. These voltages are used to program, read, and erase the cell. As mentioned earlier, the actual control gate voltage is not constant, and a sequence of programming pulses will start with low values of control gate voltages and climb up from pulse to pulse in order to get each and every cell to its target VT without overshooting any of them. In specific embodiments, there are multiple pumps, providing a variety of high voltages, in other embodiments, even negative voltages are produced. Generally the output voltage value of these pumps are set in design, and there are various pumps to provide for various ranges of voltage, for example, the VPP pump may produce 7 volts, and the VHI pump will use the VPP voltage as its input and pump it higher to 14 volts at its output. However, neither VPP nor VHI are directly fed to any of the cell terminals. Multilevel cell programming operations typically are performed in gentle, incremental steps starting with minimal control gate programming values so as not to overshoot the easiest cells to program beyond the lowest VT state, and gradually increasing the control gate voltage-to a maximum value which would be sufficient to get the hardest cells to program to the highest VT state, and performing verify, and, when necessary, lock out operation after each programming pulse.

FIG. 6 shows an array of storage elements 605 arranged in rows and columns. This storage element configuration may be referred to as dual floating gate source side injection (DFGSSI) cell. In a specific embodiment, the storage elements include Flash memory cells. There are two memory devices (e.g., Flash memory cells) in each storage element. In an embodiment, storage element 605 consists of two floating gate memory cells each of which is a multistate storage element. Different types of memory cells and memory technologies may be used to implement this storage element. Multistate cells and storage elements are described in more detail in U.S. Pat. No. 5,712,180. The, storage elements of an array may be arranged in different configurations. For example, the bit lines (BL) and word lines (WL) may be run in directions different from what is shown in the figure.

The storage element has a select gate line or word line 609, a right control gate line 611, and a left control gate line 613. The right control gate line is connected to a gate or control electrode of a right floating gate transistor (TFGR) 615, and the left control gate line is connected to a gate of a left floating gate transistor (TFGL) 617. The select gate line (word line) is connected to a gate of a select transistor (TSEL) 619.

For each storage element 105, there are two floating gate transistors or cells 615 and 617 to store data. Each of these floating gate transistors may store a single bit or multiple bits of data. When storing multiple bits of data, each floating gate cell may also be referred to as a multistate, multilevel, or multibit cell, because the cell may be programmed to have more than two VT (threshold voltage) ranges. For example, each floating gate transistor may store two bits per cell, three bits per cell, four bits per cell, or an even greater number of bits per cell.

Floating gate transistors are selectively configured by placing appropriate voltages on bit lines BL1 and BL2, control gate lines 613 and 611, and select lines 609. The drains and sources of the transistors are connected to bit lines BL1 and BL2, which may be selectively connected to ground, or any other constant voltage or constant current source through transistors 628 and 632. At edges of each control gate segment, every pair of control gate lines can be merged into one electrode in order to fit their control line segment select transistors in the pitch of two floating gates as opposed to the pitch of one floating gate cell as shown in FIG. 6. For proper device operation it is essential that the two control lines that form each merged line are on opposing sides of a single bit line as shown in FIG. 6. If a pair of control lines are merged on top of a segment and then connected to a control line segment select transistor, then a neighbor pair of control lines can be merged on the bottom of a segment and connected to a segment select transistor on the bottom of the segment.

The array may be organized and subdivided into sectors of cells, and multiple sectors into erase blocks. This will allow erase of entire erase blocks of cells at a time, rather than the entire array at once. A sector can be defined as the smallest group of cells that can be written simultaneously. Typical programming operations are performed on a sector by sector basis. In one embodiment, all the cells that are on the same word line comprise 4 sectors. Every fourth pair of floating gate cells belong to the same sector. Each pair will consist of two floating gates that straddle one bit line such that the control lines of the two cells that comprise each pair are merged into one electrode at the edge of the segment. For example, a sector may contain 512 user bytes. In a four-bit per cell implementation this will require at least 1024 cells per sector. More cells are typically required for error correction code (ECC), tracking cells, rotation state, and so forth.

In operation, data is read from a selected cell by using the word lines, bit lines, and steering (control) lines. In an embodiment, the programming and read for cells are similar to that as described for the DFGSSI. This allows substitution of the cell in FIG. 6 with the DFGSSI, and all present circuitry for the DFGSSI cell may be used. There are a number of options for erase. In one embodiment erase is performed by applying a large negative voltage which can become as large as −25 volts to some control lines in each segment, e.g. every fourth pair of control lines. In another embodiment which requires that each segment is in its own isolated p-well of a triple well technology, the burden of erase is shared by both the control gate and the inner p-well. In such an embodiment the control lines go to a smaller magnitude negative voltage, e.g., −10 volts, and the rest of the burden is picked up by the p-well which is taken to moderately high voltage, e.g., +10 volts, in order to maintain a 20-volt differential between the control gate and the floating gate cell channel. In both of these embodiments erase is performed by Fowler-Nordheim tunneling of electrons across the oxide that isolates the floating gate from the channel. Both preceding embodiments will erase a block which typically consist of N sectors, where N is the number of rows in a segment. The erase block consists of one sector per word line multiplied by 64 word lines per segment.

In another embodiment, the burden of erase can be shared between the control line and the word line, where negative voltages are applied to both a targeted control line and to a targeted word line. In this embodiment the erase block size can potentially be reduced to a single sector or even a single cell. This embodiment can be subdivided into two embodiments where in the first case the p-well is at ground potential, the targeted control lines are, for example, taken to −15 volts, and the targeted word line(s) is (are) taken to, for example, −15 volts, and in another case the p-well is taken to a moderately high potential such as +5 volts, the targeted control lines are taken to, for example, −10 volts, and the targeted word line(s) is (are) taken to −12 volts. In order to be able to erase cells on one word line without disturbing the cells on another word line, the voltage difference between word line(s) selected for erase, and other word line(s) in the same segment that are not selected for erase has to be greater than a certain minimum amount $\Delta VEWL$. The erase distribution of cells can span a wide range as large as 6 volts in terms of ±5σ of the distribution of VT's of erased cells as measured from the control gate. Assuming a 50 percent control gate (both control gate and control line) to floating gate capacitive coupling ratio, this translates to a spread of 3 volts in floating gate voltages after erase. Assuming a 25 percent select gate to floating gate coupling ratio, this translates to a minimum $\Delta VEWL$ value of 12 volts. During the erase operation this minimum $\Delta VEWL$ value can be created in various ways. One way is to ground the non-selected word lines, and apply at least 12 volts to the word lines that are selected for erase. Another way is to apply −X volts to the selected word lines where X is a positive value in the range [0 volts, 12 volts], and to apply (12−−X) volts to the non-selected word lines in the same segment. In all cases, whether multiple electrodes are involved or a single electrode, it will be advantageous for at least the last electrode that is taken to the erase voltage to be gently ramped to the erase voltage. The gentle ramping of the final electrode that is driven to the erase voltage condition will reduce the instantaneous electric field in the tunnel dielectric. It is well known that new oxide trap sites can be created at electric fields above 4 MV/cm. These trap sites, once they become occupied with either electrons or holes, will change the characteristics of the memory cell transistor, and such degradation will impact the cycling endurance of the memory. If the drain is chosen as the erase electrode, then one possible set of voltages for erase is as follows: drain (that bit line which is adjacent the targeted cell) voltage of 3 volts, Control gate voltage of −8 volts, substrate (or inner p-well of a triple well) voltage of 0 volts, word line voltage of −12 volts. To increase cycling endurance, a gradual ramping of all, or at least the last one of the erase voltages to be applied to the cell is recommended. This is done in order to reduce the instantaneous electric field at the onset of erase. Too high a field can create new trap sites in tunnel oxides. These trap sites can become charged at any time and the charged traps can impede desired conduction through the tunnel insulator during program or erase, or enhance parasitic conduction through the tunnel insulator. Traps can cause a drift of various transistor characteristics such as programming voltages, erase voltages, and intrinsic VTs. The bit line voltages in all the various erase schemes that have been considered can either be the same as the p-well voltage, or at a higher voltage than the p-well voltage forcing the erase to occur between the floating gate and the near side bit line. In yet another set of embodiments the bit lines can be floated during the erase operation.

In a specific embodiment, the invention will be described with respect to the specific storage element structure shown in FIG. 6, where there are two floating gate transistors per element. However, the invention may be used in any integrated circuit requiring a nonvolatile storage element. For example, the invention may be used for storage elements where there is a single floating gate transistor per element. There may be a single floating gate transistor and a single select transistor in each cell. The invention may be used as memory cells or storage elements organized in NOR or NAND arrangements described above.

The invention provides a pillar floating gate memory cell or storage element. FIG. 7 shows a top view of a layout of storage elements of the invention for the array configuration of FIG. 6. This is one specific implementation and there are many other implementations of the invention. A floating gate 708, which is composed of polysilicon-1 or poly-1, is for a first floating gate transistor. A word line 715 is run in polysilicon-4 or metal-1. A control gate 719 is run in polysilicon-2. A bit line is run in local interconnect (LI) polysilicon 728. A diffusion or active area 726 is typically n-type diffusion for n-channel or NMOS transistors.

In other implementations of the invention, the different structures of the storage element may be run in different layers. For example, the word line may be run in a metal layer.

In this implementation, the word lines and active areas are run in a first direction. The bit lines composed of a BN+ (buried highly doped N type region) diffusion which may also be fortified with a local interconnect poly (LI poly), and control gate lines are run in a second direction, transverse to the first direction. Typically, in the layout of a memory array, the bit lines and word lines are transverse or perpendicular to each other. However, in other implementations, the word lines, diffusion, bit lines, and control lines may be run in any combination of directions, where some lines are transverse and other lines are parallel.

The benefits of the cell is as follows: In most Flash technologies every effort is made to increase the floating gate's capacitive coupling to the control gate, given that the capacitances to the drain, and select gate can be parasitic from a program or an erase operation perspective. In a set of specific embodiments of this invention the intent is to deliver the necessary voltages for program operations and for erase operations through both the control gate and the select gate. Therefore effort is made to increase the select gate coupling to the floating gate. Because now the select gate delivers part of the required erase and programming voltages to the floating gate, it is important to operate the select gate at both high positive and high negative voltages. To do so safely requires a thick oxide under the select gate so that the dielectric does not break down. With a thick select gate oxide, the select gate transistor's control over the channel diminishes causing poor turn on and turn off characteristics, and shallow sub-threshold slopes. This can lead to disturb conditions where off word lines will have leaky select gates. In order to avoid this, the pillar cell's select gate length can be increased without increasing the cell area. This is accomplished by having the select gate channel meander up and down.

Additionally, by completely wrapping the floating gate with the control line in one direction, and the word line in the other direction we have eliminated or reduced the parasitic floating gate to neighbor floating gate capacitance which can result in read errors. Moreover, a meandering select gate results in normal (perpendicular) or near normal electron impingement upon the Si/SiO2 interface at the source side electron injection point. Also a certain minimum voltage has to be imparted to the floating gate before any erase or programming action is initiated.

In multistate cell operations, where the group of cells that are being simultaneously programmed or erased are all on the same word line, some or all of this minimum required voltage for the onset of programming or the onset of erase can be delivered by the select gate. The remaining voltages that are needed for programming, or for erasing, are delivered by the control gates, where each control line is independently driven to the appropriate level based on its present state and its data dependent target state. Programming and erasing each cell by delivering the voltages partially through the word lines, and partially through the control gates not only reduces disturb phenomena, but also provides an opportunity for individually tailored erase voltages where a group of cells on the same word line can be erased in parallel while each cell being erased with its own individual control gate erase voltage. This tightens the erase distribution and makes for a larger operating window.

FIG. 8 shows a cross-sectional view of an embodiment of pillar cell structures of the invention, where a cut is made along a word line and across two bit lines of an array of such cells, such as shown in FIGS. 6 and 7. This figure shows a slanted shallow trench etch for the bit lines and the select gates. However, depending on the process technology used, this trench may have straight, vertical walls instead of the graded or slanted walls as shown. In this particular embodiment the control lines are shown as being designed wider than the width of the control gates which form the top of each pillar. This allows for lithographic misalignment between the two layers. This may not be a preferred embodiment in the sense that the two side walls of each floating gate that are perpendicular to the plane of FIG. 8 will face drooping portions of the control lines increasing the floating gate to control gate coupling at the expense of the floating gate to select gate coupling.

A unit of two floating gate transistors 801 and 808 and a select gate transistor 813, which in one embodiment, are n-type devices may be repeated as many times as needed. In a specific embodiment, the floating gate transistors are multistate cells, capable of storing two or more bits of data. In an implementation, the floating gate transistors store three bits of data, which corresponds to eight different stored states. In an implementation, the floating gate transistors store four bits of data, which corresponds to sixteen different stored states.

A floating gate transistor 803 is for a neighboring unit. Each floating gate transistor is built using a pillar structure, where a trench or gap separates the two floating transistors. A trench 810 separates cells of neighboring units, and a trench 814 separates cells in the same unit. The memory array area is constructed by the blanket deposition/growth of several layers up to and including the poly-2 control gate layer. Then the layers are etched into strips along a first direction, followed by another masking step that etches the various layer into individual pillars by utilizing a mask that forms strips in a second direction that is transverse to the first direction. Typically, floating gates are from the same process layer, namely poly-1. The stacked layers may be called a pillar stack.

The initial layer shown in the figure is a p-type layer 811 which may be the substrate or well material. The layer may also be an n-type layer in the case the floating gate, and the select gate transistors are p-type devices. Above the layer 811 is an oxide layer 815. This oxide may sometimes be referred to as a tunnel oxide because electrons may tunnel through this oxide. Above insulating oxide 815 is a polysilicon floating gate layer 819. Above layer 819 is an oxide-nitride-oxide (ONO) layer 822. Above ONO layer 822 is a polysilicon-2 control gate layer 825. The ONO insulating layer separates the floating gate and control gate layers. Above and contacting the control gate layer is a polysilicon or metal control gate line or control line layer 829. In the embodiment of FIG. 8 the width of the control gate line 829 is greater than a width of the polysilicon-2 control gate 825.

The pillar cell is covered or encapsulated on all sides by insulating material layers. These insulating layers are an typically oxide layers such as oxide layer 831. The encapsulating insulator that surrounds the floating gate of the pillar cell is covered on some sides by a poly or metal word line 832. The oxide layers may be formed by depositions or growths performed at various stages of the process flow. The thickness of these layers may vary substantially at different areas. Above layer 832 is a silicide or metal word line layer 836 which reinforces the conductivity of the lower poly word line layer. There is a buried diffusion region 839, which is the drain or source of the transistors, and will be a local bit line of the array. The diffusion region extends along the bottom of the trenches that separate the pillar cells on one word line from the pillar cells on a neighbor word line.

Optionally, a local interconnect polysilicon layer 843 may be used to connect to diffusion 839 and used as the bit line. This could be done in addition to the BN+ diffusion strips, or the local interconnect (LI) poly could connect a number of disjointed bit line diffusions in order to form a bit line. Generally, the local interconnect polysilicon will have a lower resistance than diffusion, and using the local interconnect polysilicon will reduce the resistance of the local bit lines.

In an embodiment, the pillar cell is formed in a triple well structure. FIG. 9 shows an example of a triple well structure on a p-substrate 903. A deep n-well 906 is formed on the p substrate by using a very high energies implant. An n-well implant using lower energies is performed on the sides of the intended p-well. A p-well 909 is formed in the n-well. An n diffusion region 914 is representative of the n+ diffusion used to form a transistor's source or drain region. The substrate is typically grounded. A triple well structure allows nonzero voltages to be connected to the local substrate (i.e., inner p-well) terminal or terminals of a subset of memory cell transistors (e.g., the inner p-well that contains a block) in an array. These nonzero voltages will not cause excessive leakage currents from/to the common die substrate because the application of appropriate voltages to the n-well that is between the two p-type regions will allow all junctions to be either unbiased or reverse biased. When the inner p-well is taken to a negative voltage the n-well will typically be grounded, and when the inner p-well is raised to a positive voltage the n-well will also be raised to the same positive voltage.

In FIG. 6, if two neighbor cells are tiled horizontally next to each other then they share the same word line assuming they are both part of the same word line segment. In FIG. 6, if two neighbor cells are tiled vertically next to each other then they share the same control (steering) line assuming they are both part of the same local control line segment. In an embodiment, there is a distinction between trenches that are between two floating gates on the same word line and trenches that are between two floating gates on the same bit line. The former trenches are always filled with the word line layer 836. A cross section in a perpendicular direction to the one shown in FIG. 8 will reveal that trenches between two floating gates on the same control line are filled with the control line layer 829 as can be seen in FIG. 13 where 1329 is the same as FIG. 8's 829.

The pillar cell maybe operated (read, write, erase) upon as other Flash memory cells are, as was described above. However, the pillar structure cell provides a number of benefits over conventional Flash memory cells.

One effect that is of particular concern is the parasitic capacitive coupling between two neighbor floating gates which can cause read margin erosion or even erroneous reads specially in multistate implementations. Specifically, this phenomenon occurs by reading the floating gate of a first cell. Then, program and verify a second cell, a neighbor of the first cell. Read the first cell again, but this time the stored VT of the first cell has been altered because the amount of charge stored on the second cell has changed, and some of this change has capacitively coupled to the first cell. As can be appreciated, any change in the stored VT value is undesirable because it reduces the separation margins between states. These state-to-state separation margins are required for rapid sensing, and to combat disturb and charge gain/loss phenomena. Erosion of the separation margins can adversely affect the storage life of the stored data, reduce reliability, and may even cause data errors. The capacitive coupling is of special significance for multistate cells, where the VT levels are packed closer to one another, and the margins are necessarily smaller.

Because this capacitive coupling phenomena is reversible by erasing the second cell to its original state, some people may not use the term "disturb" to describe this phenomena. But rather, the term "disturb" will be used for nonreversible phenomena where actual charge has been lost or gained as a result of high stresses associated with certain operations.

The presence of other conductors or semiconductors between two opposing sidewalls of two neighbor floating gates significantly reduces the capacitive coupling between these two floating gates. One advantage of the pillar cell is that each floating gate is almost completely shielded from any neighboring floating gates by either the presence of a drooping control line, or the presence of a drooping select gate.

To alleviate charge disturb phenomena, to confine the size of, for example, erase blocks, and to reduce both the resistance and the capacitance of various lines the memory array is typically segmented into bit line segments, steering or control line segments, and word line segments. Reducing both the resistance and the capacitance of various lines reduces the RC time constants of these lines, and can have a positive impact on read, erase, and write speeds. Segmenting the array refers to breaking the continuity of various local lines of the array every so many cells. Typically each segmented line is connected to the periphery of the array through a segment selection transistor, and a global line.

The term disturb typically refers to a nonreversible phenomena where actual charge is lost or gained by the disturbed floating gate as a result of the high stresses associated with certain operations such as programming, erasing or even reading. An erase block is the smallest group of cells that can be erased at the same time.

In one implementation, namely the dual floating gate source side injection cell (DFGSSI) utilizing channel erase, and highly negative voltages on steering (control) lines the steering (control) gate segmentation had to be performed at a frequency of one segmentation for every 512 word lines. This was necessary in order to limit the size of the erase blocks to a manageable level. The area required to accommodate the high voltage steering gate segmentation transistors with their associated isolations and independent wells would increase the size of the array by over 20 percent. More frequent segmentations, such as once every 256 rows, would increase the size of the array by over 41 percent. In that same implementation, one bit line segmentation exists for every 128 rows. Each bit line segmentation area has a width equivalent to 10.8 word line widths. Bit line segmentation areas then represent 10.8/(128+10.8)=7.8 percent of the array area assuming there are no control gate segmentations. Bit line segmentations are required primarily because of the high resistance of the local bit lines. This invention may to some extent alleviate the requirements for bit line segmentations, such that local bit line segments can be longer. The reason is that in the implementation that includes the local interconnect poly for the bit lines, the trenched local interconnect poly can be thicker than prior art, and also the buried n+'s can form local bit lines making the local interconnect poly's role supplemental. Additionally, because of improved programming efficiency of the pillar cell, the bit line programming current may be much smaller affording larger bit line resistances associated with longer local bit lines. Lower programming and read currents will allow the parallel operations of greater number of cells, which in turn, increases the read and write speeds.

More specifically, an exemplary DFGSSI cell structure utilizes a triple well, channel erase technology with very large separations between bit line segments (3.775 um) (3.775 um/0.35 um/word line=10.8 word lines), and an even larger spacing between control gate segments (40.0 um) (40.0 um/0.35 um/word line=114.3 word lines). The term "um" is used to signify micron. If the area used to separate two bit line segments were to be used for memory cells, then that same area would accommodate an extra 11 word lines. Each bit line segment consists of 128 word lines. So for every group of 128 word lines, about 11 word lines worth of area is consumed for bit line segmentation.

The same argument extended to control gate segmentations will show that for every 512 word lines, an additional 114 word lines worth of area is consumed for control gate segmentation. This reduces the array efficiency to 76.5 percent just due to segmentations. With single word line erase capability, and lower operating cell currents, the bit line and the control gate segments can both be increased in size, spanning larger number of word lines. This will increase the array efficiency.

The pillar structure cell of the invention reduces the floating gate to neighbor floating gate capacitive coupling effect described above. The reason for this is that each pillar cell is surrounded by polysilicon (or metal) 836. Specifically, the pillar structure cell significantly reduce the capacitive coupled effect (i.e., floating gate to neighbor floating gate coupling) by almost completely isolating the floating gates from one another through the use of trenched select gates and trenched steering lines. This reduces the capacitive coupling between neighboring cells.

The pillar cell technology will, among other improvements, dramatically increase the array efficiency by reducing the frequency with which the array has to be segmented. This is achieved through lowering some disturb mechanisms, and reducing the erase block size by using both the word lines, and the control gates to deliver the erase voltage to each cell. In this manner the erase operation is performed by selecting both a cell's word line and its control gate. So single sector erase and even single cell erase will be possible (i.e. EEPROM characteristics with one transistor per cell).

Furthermore, the pillar structure cells allow single word line, or even single cell, channel erase by delivering the erase voltage through both the steering lines (control gates at up to about −12 volts), and the word lines (select gates at up to about −15 volts).

Note that actually the longer a line the greater the chance of disturb because with longer lines more cells are exposed to disturb conditions. If a local line is 64 cells long then every time one cell is programmed, 63 other cells get exposed to the bit line and control line program disturb condition.

Higher operating select gate voltages create a larger difference between the sub-threshold current of an unselected row and the current of a selected row. This reduces program disturb, read disturb, and read errors caused by leakage currents of unselected rows.

The pillar structure cell has a nitride layer of the ONO stack which is confined to the top of the floating gates, and therefore does not come anywhere near the channel area. This will improve cell endurance and lower charge trapping which is prevalent at the nitride-oxide interfaces. In the pillar cell this trapping phenomena is confined to the top of the floating gates and the ONO layer does not come any where near the channel where its trapping tendencies may affect the characteristics of the floating gate or select gate transistors. VT relaxation effects are also reduced by eliminating the presence of nitride layers in insulator regions where charge transport occurs during programming or erasing.

The pillar stack benefits from a self-aligned (i.e., poly-1 and poly-2 stack to trenches) process that will increase the channel/tunnel insulator quality, reliability, and cycling endurance. Some fabrication,techniques are described below.

For the pillar structure cell, the edges of the channel benefit from slightly thicker oxide, shifting the conduction toward the center of the channel, and away from the edges. This should lower device noise because the edges suffer from mechanical stress and therefore have higher densities of defects/traps. These traps, erratic behavior of trapping, and releasing charges can be a significant source of noise.

Another benefit of the pillar structure cell is to provide programming efficiencies that may be orders of magnitude higher than the standard source side injection through nearly normal angle (i.e., nearly 90 degrees or perpendicular) electron impingement. The current or electron path is indicated by an arrow 855. Arrow 855 shows an electron flow path from the source to the drain. The drain 857 will be at, for example, 5 volts, while the source 859 will be at, for example, 0 volts. As electrons flow from source to drain, a small percentage will be injected into the floating gate, as indicated by arrow 850, which is at nearly normal angle to the channel-gate insulator interface. The injection takes place at the side of the floating gate that is adjacent a select gate, and on that floating gate of a pair which is closer to the drain of programming. And the drain of programming is the bit line with the higher voltage. The source-to-drain electron current path at the injection point is nearly normally oriented to the channel oxide interface. Therefore, a scattering event is not required to divert a few lucky electrons across the oxide and into the floating gate, instead the momentum of the electrons is already in a direction that helps them to penetrate the oxide energy barrier giving rise to the ballistic injection conditions that will more efficiently direct the electrons across the channel oxide barrier and into the floating gate, which should make programming more efficient. A meandering channel results in normal (perpendicular) or near normal electron impingement upon the Si/SiO2 interface at the source side electron injection point.

The angle of electron flow into the floating gate will depend on the grade of the sidewall of the pillar or trench. The angle will be the same angle as the trench sidewalls. For example, for 90-degree trench walls, the electron flow angle into the floating gate will also be 90 degrees or less. For 85-degree trench walls, the electron flow angle into the floating gate will also be 85 degrees or less. For 80-degree trench walls, the electron flow angle into the floating gate will also be 80 degrees or less. For 75-degree trench walls, the electron flow angle into the floating gate will also be 75 degrees or less.

The source side injection programming efficiency is dramatically increased (possibly even one thousand fold) by using the original momentum of the hot electrons to put them across the Si/SiO2 barrier. This structure allows electrons to impinge on the surface at angles close to normal, as opposed to relying on scattering to divert the momentum of a few lucky electrons towards the Si/SiO2 interface. More discussion on the "lucky electron" model of electron injection into SiO2 is found in C. Hu, "Lucky electron model of hot electron emission" IEEE IEDM Tech. Dig., p. 22 (1979), which is incorporated by reference. The improved efficiency translates to faster programming, more potential parallelism, less power consumption, and less program disturb, because the programming time and current have been reduced.

Depending on the substrate doping density, and the operating voltages, an extended depletion region may be formed during the programming. This extended depletion region may spread the programming injection current along the length of the floating gate, as opposed to keeping it concentrated to a small region close to the select gate. This may be a desired effect since it may increase the cell endurance at the expense of a small degradation of the programming efficiency.

If the operating word line programming voltage is not the same value as the operating word line read voltage, then the word line RC time constant has to be small in order to make it possible for the word line to rapidly change voltages between program and verify. The low word line RC time constant will also facilitate the rapid change of the word line voltage many times during every read or verify in order to reduce noise as described in U.S. patent application Ser. No. 10/052,924, filed Jan. 18, 2002, entitled "Noise Reduction Technique for Transistors and Small Devices Utilizing an Episodic Agitation," now U.S. Pat. No. 6,850,441, which is incorporated by reference. Very high operating word line voltages are intended to provide a significant part of the voltage coupled to the floating gate during programming or erase operations. So a high select-gate coupling ratio is desired. A high select gate coupling ratio will allow the word line to take over from the control line the role of being the electrode that supplies the agitating stimuli that help to reduce the effects of noise. Since the thousands of cells that are being read or verified at any given time belong to one, or at most a few, word lines, providing the high voltage and high frequency agitating stimuli to just a few word lines becomes feasible from a power consumption point of view, where as to deliver the agitating stimuli through control lines would require thousands of control lines to rapidly make several transitions of multiple volts for each single verify operation. The associated power consumption of delivering the agitating stimuli through the control line would be prohibitive.

In one embodiment, an example of which is shown in FIGS. 18 and 19, the lower part of each select gate (the part that faces the channel) is separated from the upper part of the select gate (the part which faces the floating gates) by a thin tunnel oxide that allows direct tunneling between the lower and upper select gates. In this manner, not all the word line voltage pulse for programming is transferred to the lower select gates. This will allow the upper select gates to provide a higher common mode coupling voltage to the floating gates on a given word line, bringing them to the onset of programming of the lowest threshold state, while the lower part of the select gates are at a lower voltages that allow a more efficient source side ballistic injection.

The control gate voltages, which in some architectures, may be uniquely controlled on a per cell basis will provide the remaining coupling to allow the data dependent programming on a per column basis. At the same time, the lower select gates are operating at lower voltages so that their voltage is slightly above the threshold of the select transistor. In this manner, source side injection is not suppressed by exceedingly high select gate voltages. The direct tunneling resistance between the lower and upper select gates will be controlled such that over short time scales corresponding to one or multiple programming pulses a significant amount of tunneling does not take place. But, over longer time spans between one sector programming, and another sector programming, a possibly charged up lower select gate can discharge.

Alternatively, a varying dopant concentration along the vertical axis of the select gate pillars may provide some electrostatic potential difference to accomplish the same objective without the need for separating the upper and lower select gates with a tunnel oxide.

Yet another approach is to raise the threshold of the select gate to such an extent that source side injection will be possible and efficient at voltages as high as 6 volts to 8. volts. The rest of the common mode floating gate voltage, needed for the onset of programming, will have to be supplied by the control gates.

In yet another embodiment, a partial fill of the select gate cavity with the select gate poly, followed by oxide etch on the sides of the floating gates can be used to create a dual thickness select gate oxide. The select gate oxide facing the channel can be processed to be thicker than the select gate oxide facing the floating gates. In this manner, a lower select gate voltage of say 6 volts that is consistent with optimal ballistic source side injection programming can couple a sufficiently high voltage to the floating gates that together with the control gate voltage allow programming to the highest desired VTs.

FIG. 10 shows another cross-section of the pillar cell along a word line and across two bit lines of pillar structure cells, where for two neighboring cells, every pair of control gate lines that reside on two sides of the same bit line are designed to be closer together compared to every pair of control gate lines that reside on two sides of the same select gate. This embodiment is similar to the one in FIG. 8. A difference between the embodiments is the control gate line pairs are closer together than to neighboring pairs. FIG. 10 shows two options for forming the select gate and poly4 word line. One option is to shape the poly4 floating gate to floating gate shield over the bit lines as shown in the solid figure, and the other is to deposit the poly4 in two steps forming the dotted line profiles 1003 and 1006. It should be noted that if this embodiment is employed, then care should be taken during the step that etches the select gate material such that the reentrant select gate material is etched completely in the space between two word lines, not leaving stringers that would short neighbor word lines. A combination of anisotropic, vertical plasma etching and isotropic wet etching may have to be used to guarantee the suppression of such stringers.

FIG. 11 shows another cross-section of the pillar cell along a word line and across two bit lines of pillar structure cells, where a width of the control gate line is less than a width of the control gate, allowing a misalignment margin equal to half of the control gate width minus control line width. This embodiment is similar to the one in FIG. 8. The select gate for one storage element is indicated by the arrows 1115. Note that a width 1118 of the control gate line layer 1129 is less than a width 1124 of the polysilicon-2 control gate 1125. The opposite is true for the structure in FIG. 8.

FIG. 12 shows another cross-section along a word line and across two bit lines of pillar structure cells, similar to FIG. 11, but without local interconnect polysilicon.

This embodiment is similar to the one in FIG. 11. In this embodiment, local interconnect polysilicon is not used for the bit line, as it was in FIG. 11.

FIG. 13 shows a cross-section along the control line and across several word lines for an implementation of pillar structure cells. This cross section pertains to many of the previous embodiments of the pillar cell of the invention, where a cut is made along the control lines, parallel to the bit lines, and across the word lines, and channel lengths of an array of such cells. The structure is formed in a p-well or p-substrate 1306. In the pillar stack, there is channel insulator (i.e. tunnel oxide of many embodiments) 1310 on the p-well or p-substrate, polysilicon-1 floating gate 1315, ONO layer 1319, and polysilicon-2 control gate 1325. Contacting the control gate is a polysilicon or metal control gate line 1329. This line runs along the top of control gates, contacting them, and meanders down into part of the depth of the isolation trenches that separate neighbor pillars. Above the control gate line is insulator 1333, and above insulator 1333 is a polysilicon or metal word line 1336. On the sides of the pillar structure, separating the layers of the stack from control gate line 1329 is insulator 1340. Insulator 1337 fills the spaces between word lines.

FIG. 14 shows a cross-section along a word line and across two bit lines of pillar structure cells for another implementation where the select gate does not widen in the space between two neighbor poly-2 control gates. This embodiment is similar to that of FIG. 8 except that poly select gates are not deposited in two separate phases. In this embodiment the reentrant poly-3 corners do not exist, reducing the potential for poly stringers that would short neighbor word line to one another. The disadvantage of this embodiment is the reduced select gate to floating gate coupling.

FIG. 15 shows a cross-section of a pillar cell along a word line and across a bit line for another implementation of pillar structure cells, where the side walls of the pillars are vertical and local interconnect polysilicon is not present. In this figure, the local interconnect polysilicon does not exist or is not used. This embodiment has pillars with vertical walls on each side.

FIG. 16 shows a cross-section along a word line and across a bit line for another implementation of pillar structure cells, similar to FIG. 15, where the gates of the select transistors are composed of one layer of poly, and these isolated select gate pillars are later connected to each other along the direction of word lines to form the word lines using a metal layer, or yet another poly layer which can later be silicided. The select gates and word lines are implemented in two different layers. This configuration is similar to FIG. 15, except that the metal word lines do not run into the trench, but instead they contact poly select gate pillars.

FIG. 17 shows a cross-section along a control line and across three word lines for those implementations of pillar structure cells which have vertical pillar/trench walls including the embodiments of FIGS. 15, 16, 18, and 19. This is a transverse cut to that of FIG. 15, 16, 18, or 19.

FIG. 18 shows a vertical trench/pillar wall embodiment with the addition of a new feature which consists of a thin tunnel insulator that separates the lower poly select gate from the upper poly select gate. This tunnel barrier's thickness is in the range of 0.5 nm to 4 nm so as to allow tunneling in the direct tunneling regime. The purpose of this feature is to allow the instantaneous voltage of upper poly select gate to be higher than that of the lower poly select gate as the word line voltage is rapidly ramped up to the programming word line voltage. In the early part of each word line programming pulse the upper select gate will be at a very high voltage, coupling a significant voltage to the floating gates on the selected word line, whereas the lower select gate poly will be at a lower voltage which may be ideal for a more efficient source side ballistic injection. The tunneling resistance and capacitance of the insulator that separates the upper from the lower select gate has to be such that in the time interval between two successive programming pulses the lower select gate voltages re-equilibrate with the inter-pulse word line voltage of most probably zero volts. Employing this feature will lift the requirement of having an exceeding large select gate threshold voltage that would allow efficient ballistic source side injection at high select gate programming operating voltages. With this restriction lifted the thickness of the insulator between the select gate and the floating gate, which in most embodiments is the same as the thickness of the insulator between the channel and the select gate, can be reduced, thereby increasing the select gate to floating gate coupling ratio.

FIG. 19 shows a similar embodiment to that of FIG. 18 with the difference that in FIG. 19 the upper poly word line forms a continuous word line which can also be reinforced with another metal layer or silicidation, whereas in FIG. 18 the upper select gate poly form disjoint pillars which then have to be connected along the direction of the word lines using an additional deposited layer such as a metal layer that joins the pillars to form a word line.

The following describes two example process flows for fabricating the pillar structure cell of the invention. There are many variations to these flows and many other flows are also possible. Also, the order of many of the steps are interchangeable.

Flow 1 is described below. In flow. 1, an isolation etch along the word lines is performed before the bit line and select gate etch.

Step 1: Perform the optional triple well implants and anneals in the array area, or mask the memory array with photoresist to avoid building the memory array in a triple well. Perform a shallow implant to set the threshold of the floating gates.

Step 2: Grow a thin tunnel oxide which is about 8 nanometers to about 10 nanometers in thickness on the entire array area.

Step 3: Deposit polysilicon (poly-1) layer and implant it with n-type dopants, or in-situ dope the poly-1 layer. The poly-1 thickness will affect the control gate and the select gate coupling ratios. Generally, the thicker the Polly layer the greater these coupling ratios.

Step 4a: Then a 5 nanometer to 6 nanometer oxide layer is grown on the poly-1 layer. Next a nitride layer of 5 nanometers to 6 nanometers is deposited. Then the nitride is oxidized to create a 5 nanometer to 7 nanometer oxide. This completes the ONO. Either one or both oxide layers of the ONO can be deposited instead of grown. Deposition, as opposed to growth, may reduce the thermal budget. If oxides are deposited, then a high temperature oxide densification may improve the quality of the oxide. Also each one of the oxides may consists of various deposited and grown layers.

Step 4b: As an alternative, the ONO may be replaced with a single grown or deposited oxide layer, or both.

Step 5: Now a poly-2 layer is deposited on the entire array area. The poly-2 layer may either be implanted or in-situ doped.

Step 6: Deposit a stop etch nitride layer. Up to this point all growths, implants, and depositions are in blanket form. There are no varying features in the plane of the wafer.

Step 7: Now a lithography step is performed to define the isolation between cells on different word lines. This mask consists of strips in the direction of the word lines.

Step 8: A sequence of etch steps performed on various layers which are encountered creates the isolation trenches to a depth of about 200 nanometers to about 400 nanometers into the substrate.

Step 9a: An implant may be performed at this point to raise the VT of the bottom and/or the side walls of the isolation regions. Step 9a is optional and may be skipped.

Step 9b: Skip 9a.

Step 10: A thick oxide layer is deposited to completely fill the trenches, and then etched or polished back to leave the isolation oxide in the trenches.

Step 11: A lithography step is performed in order to etch shallow trenches into the various layers to about a depth of 200 nanometers to 400 nanometers into the silicon substrate. These trenches are long strips along the direction of the bit lines. For N bit lines in the array, there will be 2*N+1 strips. All the odd strips, including the first and the last strips, will be processed to form bit lines. The even strips will be processed to form select gates in recessed cavities.

Step 12: The isolation oxide over the bit line regions (areas of intersection of bit line strips with isolation oxide strips) has to be etched down to bare silicon prior to the buried n+ implant. If the isolation etch of step 8 is deeper than the bit line/select gate etch of step 11, then each bit line will consist of a buried n+ silicon surface which meanders up and down as it passes from cell to cell along the direction of the bit lines. If the two etches of step 8 and 11 are to the same depth into the silicon substrate, then the bit lines will not be meandering up and down.

Step 13a: A thermal oxidation process is performed to grow a thin sacrificial oxide on the wafer or skip step 13a.

Step 13b: Skip step 13a.

Step 14a: The entire wafer is implanted with the select gate VT implant. This also includes angled implants for doping the sidewalls of the select gates. Step 14a is optional and may be skipped.

Step 14b: Skip step 14a.

Step 15a: A thin oxide is grown. This step may be skipped.

Step 15b: Skip step 15a.

Step 16: To form the source/drains of the Flash cells, and the connectivity along the bit lines, the even strips are covered with photoresist, and the odd strips are implanted with arsenic (As) or phosphorous (P), or both, to form the N+ diffusions. Angled implants will dope the sidewalls of the bit line trenches.

Step 17a: Bit lines may be reinforced with an optional local interconnect poly layer which after implant, photolithography, and etch would only remain in the bit line trench strips. The local interconnect poly is possibly unnecessary, and will most probably only add to the process complexity. If local interconnects are to be included, then the sacrificial oxide that covers the bit line regions has to be etched away first. This step may be skipped.

Step 17b: Skip 17a.

Step 18a: If step 14a was chosen, then proceed to step 19.

Step 18b: If step 14b was chosen, then a lithography step is performed to cover the odd bit line strips. The even strips (select gate strips) are implanted to adjust the thresholds of the select gates.

Step 19: An etching step to etch the nitride on the control gates is required to expose the poly-2 control gates.

Step 20: The oxide separating the steering lines from the floating gates on the sidewall areas has to be grown or deposited, or both. This oxide may be in the form of a spacer, and its thickness is governed by the reliability concerns relating to maximum voltage difference between the floating gate and the control gate.

Step 21: A poly or metal layer is deposited, patterned, and etched to leave narrow strips that form the steering lines by connecting the control (steering) gates. The steering lines run in the same direction as the bit lines.

Step 22: Etch the exposed oxide covering the wafer so as to remove the oxide covering the select areas. If this is not done and instead additional oxide is grown, then the select gate oxide ends up being thicker than the oxide separating the steering lines from the select gates, whereas a reverse situation is desired.

Step 23: Grow or deposit oxide, or both, on the wafer to form the thicker select gate oxide, along with the oxide separating the steering lines and the bit lines from the select gates. If, despite the faster oxide growth rate of highly doped bit line regions, the bit line to word line separation oxide is not thick enough, then a thicker oxide has to be grown or deposited, or both. And a subsequent masking step may be required to thin down the select gate oxide only. A relatively thick select gate oxide of thickness anywhere from about 15 nanometers to about 30 nanometers is needed to support the high operating voltages of the select gates.

Step 24: The select gate poly is now deposited, masked and etched. This poly layer can be silicided to reduce the word line resistance.

Step 25: Deposit an oxide layer and polish or etch back to planarize the memory array before metallization. Conventional semiconductor metallization techniques can be used to complete the process.

Note that the memory array area has blanket uniformity after the deposition of poly 2, which provides the following benefits. This confines the nitride layer of ONO to top of the floating gate, keeping all nitrides at a safe distance from the select or floating gate channels. Process uniformity, and the quality of various insulating layers (e.g. oxides) including the tunnel insulator will be improved. The channel insulator thicknesses will be more uniform, allowing more uniform erase characteristics. The charge conduction through the tunnel oxide will be more uniform, increasing program/erase cycling endurance of the memory, and providing for tighter distributions of erased cell VT's. In the pillar cell, the shallow isolation trenches are parallel to the word lines and separate one word line from a neighbor word line, so that two neighbor cells on the same bit line are isolated from one another by a trench.

Flow 2 is described below. In flow 2, the bit line and select gate etch is performed before the isolation etch along the word lines.

Step 1 to 6: Same as steps 1 to 6 for flow 1 above.

Step 7: A lithography step is performed to etch shallow trenches into the various layers to about a depth of 200 nanometers to 400 nanometers into the silicon substrate. These trenches are long strips along the direction of the bit lines. For N bit lines in the array, there will be 2*N+1 strips. All the odd strips, including the first and the last strips, will be processed to form bit lines. The even strips will be processed to form select gates in recessed cavities.

Step 8a: A thermal oxidation process is performed to grow a thin sacrificial oxide on the wafer or this step may be skipped.

Step 8b: Skip step 8a.

Step 9a: The entire wafer is implanted with the select gate VT implant. This also includes angled implants for doping the sidewalls of the select gates. This step may be skipped.

Step 9b: Skip step 9a.

Step 10: To form the source/drains of the Flash cells, and the connectivity along the bit lines, the even strips are covered with photoresist, and the odd strips are implanted with arsenic (As) or phosphorous (P), or both to form the n+ diffusions. Angled implants will dope the sidewalls of the bit line trenches.

Step 11a: If step 9a was chosen, then proceed to step 12.

Step 11b: If step 9b was chosen, then a lithography step is performed to cover the odd bit line strips. The even strips (select gate strips) are implanted to adjust the thresholds of the select gates.

Step 12: A thick oxide layer is deposited to completely fill the trenches, and then etched or polished back to leave the isolation oxide in the trenches.

Step 13: A lithography step is performed to define the isolation between cells on different word lines. This mask consists of strips in the direction of the word lines.

Step 14: A sequence of etch steps performed on various layers which are encountered creates the isolation trenches to a depth of 200 nanometers to 400 nanometers into the substrate. The isolation trenches cannot be deeper than the depth of the BN+ implant or the isolation trenches will cut the BN+ bit lines into isolated pieces.

Step 15a: An implant may be performed at this point to raise the VT of the bottom or the sidewalls, or both, of the isolation regions. This step may be skipped.

Step 15b: Skip step 15a.

Step 16: Etch the oxide to completely remove it from the trenches.

Step 17 to end: Same as steps 19 to end of flow 1 above.

Note that in a technique of the invention, blanket-type deposits and steps may be used until poly-2 deposition, at which point etching may start taking place.

Mention should be made of global metal lines for global bit lines, global metal lines (usually a different metal layer) for global control lines, bit line segmentations, and bit line segment select transistors, control line segments (in some implementations not the same size as the bit line segments) and control line segment select transistors. One of the above metal layers or possibly a new metal layer can be used to strap the word lines in order to reduce the word line resistance.

TABLE 1A

| (CCCSA) Array Terminal | Read/verify 4L & 11R | Read/verify 4R & 13L | Read/verify 5L & 12R | Read/verify 5R & 14L | Program/Recover 4L & 11R | Program/Recover 4R & 13L | Program/Recover 5L & 12R | Program/Recover 5R & 14L | Single WL Erase 5L & R & 12L & R | Block Erase 5L & R & 12L & R |
|---|---|---|---|---|---|---|---|---|---|---|
| BL 0 | DNR | SNR | DNR | SNR | SNP | DNP | SNP | DNP | BLIE | BLIE |
| BL 1 | DNR | SNR | DNR | SNR | SNP | DNP | SNP | DNP | BLIE | BLIE |
| BL 2 | DINR | SNR | DNR | SNR | SNP | DNP | SNP | DNP | BLIE | BLIE |
| BL 3 | DR | SNR | DINR | SNR | SP | DNP | SNP | DNP | BLIE | BLIE |
| BL 4 | SR | SR | DR | SNR | DP | DP | SP | DNP | BLIE | BLIE |
| BL 5 | SNR | DR | SR | SR | DNP | SP | DP | DP | BLE | BLE |
| BL 6 | SNR | DINR | SNR | DR | DNP | SNP | DNP | SP | BLIE | BLIE |
| BL 7 | SNR | DNR | SNR | DINR | DNP | SNP | DNP | SNP | BLIE | BLIE |
| BL 8 | SNR | DNR | SNR | DNR | DNP | SNP | DNP | SNP | BLIE | BLIE |
| BL 9 | SNR | DNR | SNR | DNR | DNP | SNP | DNP | SNP | BLIE | BLIE |
| BL 10 | SNR | DNR | SNR | DNR | DNP | SNP | DNP | SNP | BLIE | BLIE |
| BL 11 | SR | DINR | SNR | DNR | DP | SNP | DNP | SNP | BLIE | BLIE |
| BL 12 | DR | DR | SR | DINR | SP | SP | DP | SNP | BLE | BLE |
| BL 13 | DINR | SR | DR | DR | SNP | DP | SP | SP | BLIE | BLIE |
| BL 14 | DNR | SNR | DINR | SR | SNP | DNP | SNP | DP | BLIE | BLIE |
| BL 15 | DNR | SNR | DNR | SNR | SNP | DNP | SNP | DNP | BLIE | BLIE |

TABLE 1B

| (CCCSA) Array Terminal | Read/verify 4L & 11R | Read/verify 4R & 13L | Read/verify 5L & 12R | Read/verify 5R & 14L | Program/Recover 4L & 11R | Program/Recover 4R & 13L | Program/Recover 5L & 12R | Program/Recover 5R & 14L | Single WL Erase 5L & R & 12L & R | Block Erase 5L & R & 12L & R |
|---|---|---|---|---|---|---|---|---|---|---|
| CLP 0 | CGIR | CGIR | CGIR | CGIR | CGIP | CGIP | CGIP | CGIP | CGIE | CGIE |
| CLP 1 | CGIR | CGIR | CGIR | CGIR | CGIP | CGIP | CGIP | CGIP | CGIE | CGIE |
| CLP 2 | CGIR | CGIR | CGIR | CGIR | CGIP | CGIP | CGIP | CGIP | CGIE | CGIE |
| CLP 3 | TGR | CGIR | CGIR | CGIR | TGP | CGIP | CGIP | CGIP | CGIE | CGIE |
| CLP 4 | CGR | CGR | TGR | CGIR | CGP | CGP | TGP | CGIP | CGIE | CGIE |
| CLP 5 | CGIR | TGR | CGR | CGR | CGIP | TGP | CGP | CGP | CGE | CGE |
| CLP 6 | CGIR | CGIR | CGIR | TGR | CGIP | CGIP | CGIP | TGP | CGIE | CGIE |
| CLP 7 | CGIR | CGIR | CGIR | CGIR | CGIP | CGIP | CGIP | CGIP | CGIE | CGIE |
| CLP 8 | CGIR | CGIR | CGIR | CGIR | CGIP | CGIP | CGIP | CGIP | CGIE | CGIE |
| CLP 9 | CGIR | CGIR | CGIR | CGIR | CGIP | CGIP | CGIP | CGIP | CGIE | CGIE |
| CLP 10 | CGIR | CGIR | CGIR | CGIR | CGIP | CGIP | CGIP | CGIP | CGIE | CGIE |
| CLP 11 | CGR | CGIR | CGIR | CGIR | CGP | CGIP | CGIP | CGIP | CGIE | CGIE |
| CLP 12 | TGR | TGR | CGR | CGIR | TGP | TGP | CGP | CGIP | CGE | CGE |
| CLP 13 | CGIR | CGR | TGR | TGR | CGIP | CGP | TGP | TGP | CGIE | CGIE |
| CLP 14 | CGIR | CGIR | CGIR | CGR | CGIP | CGIP | CGIP | CGP | CGIE | CGIE |
| CLP 15 | CGIR | CGIR | CGIR | CGIR | CGIP | CGIP | CGIP | CGIP | CGIE | CGIE |
| SWL | WR | WR | WR | WR | WP | WP | WP | WP | WE | WE |
| NSWL | OWR | OWR | OWR | OWR | OWP | OWP | OWP | OWP | OWE | OWE |
| P-well | PWR | PWR | PWR | PWR | PWP | PWP | PWP | PWP | PWE | PWE |
| N-well | NWR | NWR | NWR | NWR | NWP | NWP | NWP | NWP | NWE | NWE |

Tables 1A and 1B above show an exemplary set of bias conditions for Cell-by-Cell Conditional Steering Architecture (CCCSA). There are many options for operating the CCCSA type arrays. The table above only reflects a few of the possible variations. BL 0 to BL 15 represent 16 bit lines. The array will have many bit lines, but in the particular embodiment of Table 1 there exist a periodicity of cell operations with a period of 16 bit lines, such that bit lines 16, 32, 48, and so forth will have the same operating conditions as BL 0. CLP 0 to CLP 15 are 16 control line pairs. CLP 0 is a pair of local control gate lines that surround BL 0, and so on.

Along any single word line, and on the two sides of each bit line reside two floating gate memory cells, one on the left (L) side of the bit line and the other on the right (R) side of the bit line, each of which is situated under a control line. The two control lines that pass over these two floating gates merge into a local control line pair at the end of each segment. This control line pair is operated as a single electrode. The same periodicity of 16 applies to the control line pairs such that control line pairs 16, 32, 48, and so forth will have the same operating conditions as CLP 0.

SWL stands for selected word line or word lines for a given operation. For programming, and read operations only one word line per local segment is selected. But for block erase operations all word lines in a local segment can be selected in order to erase the entire block. NSWL stands for non-selected word line or word lines. Pwell stands for the inner P-well of an array which is built in a triple well. If the memory array is not built in a triple well, then the Pwell row of Table 1B refers to the substrate terminal of the entire array whose voltage will have to be zero during all operation. Nwell refers to the N-well terminal of the memory array when the array is built in a triple well. The drain terminal always refers to that bit line that is being operated at a higher voltage than the source terminal. Electron flow will always be from source to drain.

Tables 1A and 1B are arranged such that each row represents the biases applied to a particular terminal of the array, and each column represents the a particular exemplary operation. The entries in the body of Tables 1A and 1B are names of the bias conditions as will be explained in the following lines. The last letter of each name stands for the operation: R for read/verify operations, P for programming operations, and E for erase operations. SR stands for source for read which is usually grounded. DR stands for drain for read which is typically dynamically pre-charged to a value in the range [0.4V, 1.5V], with a sensing trip point that will be lower than the pre-charge voltage by a value in the range [0.05V, 0.8V]. The trip point will have to be higher than the SR voltage. DNR stands for drain neighbor for read which is equal to DR or is at an intermediate value between the pre-charge value of DR and SR.

DINR stands for the immediate drain neighbor for read, which is usually the same value as DNR, but in some embodiments can take a different value than DNR. SNR stands for source neighbor for read and is typically at the same grounded bias of SR. SP stands for source during programming whose bias, in a preferred embodiment, is dictated by a constant current sink that sinks a current in the range [100 nA, 1000 nA]. The dynamically changing voltage that this current sink imposes on the source is typically in the range [0.3V, 2.0V] in order to maintain the constant sinking current.

DP stands for drain during programming and is in the range [3.2V, 6.5V]. SNP stands for source neighbor during programming which are typically grounded. DNP stands for drain neighbor during programming. DNP voltage is typically half the value of DP. BLE stands for bit line erase voltage which is in the range [0.0V, 2.0V]. BLIE stands for bit line inhibit erase voltage which is typically 0.0V. CGR stands for control gate read voltage whose value depends on the state of the cell being read. TGR stands for transfer gate read voltage whose value is in the range [6.0V, 8.0V]. CGIR stands for control gate isolation voltage whose value is in the range [−3.0V, 0.0] in order to suppress current sneak paths in a virtual ground array.

CGP stands for control gate programming voltage whose value is in the range [2.0V, 12.0V]. This voltage is usually stair cased from one programming pulse to the next. TGP stands for transfer gate during programming which is on the range [6.0,8.0]. CGIP stands for control gate isolation during programming which is in the range [−3.0V, 0.0V]. CGE stands for control gate during erase which is in the range [−10.0V, −25.0V].

CGIE stands for control gate inhibit erase and is either zero volts for the case of grounded word lines during erase or is a positive voltage in the range [5.0V, 12.0V] in the case of applying a negative voltage to selected word lines during erase. WR is the word line voltage during read which is in the range [1.0V, 10.0V] depending on the select gate threshold voltages. WP stands for select gate programming voltage which is in the range [1V, 10.0V] depending on the select gate threshold voltage, and on the optimum value of select gate programming voltage for the most efficient source side ballistic injection. WE stands for word line erase voltage which is either zero or a negative value in the range [−5.0V, −12.0V] for those word lines that have been selected for erase.

OWR stands for other word lines during read. These non-selected word lines are typically grounded. OWP stands for other word lines during programming. These non-selected word lines are typically grounded. OWE stands for other word lines during erase. These non-selected word lines will be at a voltage in the range [0.0V, 10.0V] in order to inhibit erase. PWR stands for P-well voltage during read which is typically zero. PWP stands for P-well voltage during programming which is typically zero. PWE stands for P-well voltage during erase which is typically zero, but in some embodiments the this voltage can be a positive value to aid in the tunneling of electrons into the channel.

NWR stands for N-well voltage during read which is typically zero. NWP stands for N-well voltage during programming which is typically zero. NWE stands for N-well voltage dame as uring erase which is typically zero, but in some embodiments the this voltage can be at the same positive value as the PWE so as not to forward bias the P-well to N-well junctions.

Table 2 depicts the biases for a Commonly Driven Steering Architecture (or CDSA).

are performed on single cells as opposed to on pairs of cells that straddle a bit line, the side that is not to be programmed can have a transfer gate voltage of zero. Alternatively, it can have a TGP voltage, and rely on the elevated source voltage to keep the cell from getting programmed.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An array of erasable re-programmable non-volatile memory cells formed across at least a portion of a semiconductor substrate, comprising:
   a two-dimensional array of spaced apart stacks of self-aligned elements including a gate dielectric layer on a surface of the substrate, a conductive floating gate on the gate dielectric, an inter-gaze dielectric layer on the floating gate and a conductive control gate on the inter-gate dielectric,
   isolation trenches formed in the substrate between and surrounding the individual stacks,
   at least a first set of elongated conductors extending across the stacks in contact with control gates thereof and protruding into spaces between the floating gates of adjacent stacks, and
   a second set of elongated conductors extending across the stacks and into spaces between the floating gates of adjacent stacks, whereby the conductors provide shielding between floating gates of adjacent stacks.

TABLE 2

| (CDSA) Array Terminal | Read/ verify 1L | Read/ verify 1R | Read/ verify 2L | Read/ verify 2R | Program/ Recover 1L & 1R | Program/ Recover 2L & 2R | Program/ Recover 1R | Program/ Recover 2L | Single WL Erase 1L & R | Block Erase 1L & R |
|---|---|---|---|---|---|---|---|---|---|---|
| BL 0 | DR | SNR | DNR | DNR | SP/LO | SNP | LO | SNP | BLIE | BLIE |
| BL 1 | SR | SR | DR | SNR | DP | SP/LO | DP | SP/LO | BLE | BLE |
| BL 2 | SNR | DR | SR | SR | SP/LO | DP | SP/LO | DP | BLIE | BLIE |
| BL 3 | DNR | DNR | SNR | DR | SNP | SP/LO | SNP | LO | BLIE | BLIE |
| CLP 0 | TGR | CGIR | CGIR | CGIR | TGP | CGIP | TGP/LO | CGIP | CGIE | CGIE |
| CLP 1 | CGR | CGR | TGR | CGIR | CGP | TGP | CGP | TGP | CGE | CGE |
| CLP 2 | CGIR | TGR | CGR | CGR | TGP | CGP | TGP | CGP | CGIE | CGIE |
| CLP 3 | CGIR | CGIR | CGIR | TGR | CGIP | TGP | CGIP | TGP/LO | CGIE | CGIE |
| SWL | WR | WR | WR | WR | WP | WP | WP | WP | WE | WE |
| NSWL | OWR | OWR | OWR | OWR | OWP | OWP | OWP | OWP | OWE | OWE |
| Pwell | PWR | PWR | PWR | PWR | PWP | PWP | PWP | PWP | PWE | PWE |
| Nwell | NWR | NWR | NWR | NWR | NWP | NWP | NWP | NWP | NWE | NWE |

Table 2 depicts the biases for a Commonly Driven Steering Architecture (or CDSA). The following describe some of the differences between CDSA architecture and the CCCSA architecture. The array operations has a period of 4 bit lines such that bit lines 4, 8, 12, . . . will have the same operating voltages as BL 0. Locking out (LO) of cells that have verified to their respective target threshold voltages is achieved by raising the voltage of their corresponding programming sources to a voltage in the range [1V, 2.5V] in order to inhibit further programming. When write operations 2. The array of claim 1, wherein the first and second sets of elongated conductors are arranged perpendicularly with each other across the array, whereby the conductors provide shielding around all sides of the stack.

3. An array of erasable re-programmable non-volatile memory cells formed across at least a portion of a semiconductor substrate, comprising:
   a two-dimensional array of spaced apart stacks of self-aligned elements including a gate dielectric layer on a surface of the substrate, a conductive floating gate on the gate dielectric, an inter-gate dielectric layer on the floating gate and a conductive control gate on the inter-gate dielectric, isolation trenches formed in the substrate between and surrounding the individual stacks, at least a first set of elongated conductors extending across the stacks in contact with control gates thereof and protruding into spaces between the floating gates of adjacent stacks, and select transistors formed in trenches adjacent the stacks that include gates within the trenches formed of ends of the portions of the first set of elongated conductors protruding into the spaces.

4. An array of erasable re-programmable non-volatile memory cells formed across at least a portion of a semiconductor substrate, comprising:

a two-dimensional array of spaced apart stacks of self-aligned elements including a gate dielectric layer on a surface of the substrate, a conductive floating gate on the gate dielectric, an inter-gate dielectric layer on the floating gate and a conductive control gate on the inter-gate dielectric, isolation trenches formed in the substrate between and surrounding the individual stacks, at least a first set of elongated conductors extending across the stacks in contact with control gates thereof and protruding into spaces between the floating gates of adjacent stacks, and select transistors formed in trenches adjacent the stacks that include gates within the trenches that are coupled with portions of the first set of elongated conductors protruding into the spaces through layers of tunnel dielectric therebetween.

5. An array of erasable re-programmable non-volatile memory cells formed across at least a portion of a semiconductor substrate, comprising:

a two-dimensional array of pillars that are rectangularly shaped in plan view across the substrate and which are individually formed of elements with their four edges self-aligned with one another including a gate dielectric layer on a surface of the substrate, a conductive floating gate on the gate dielectric, an inter-gate dielectric layer on the floating gate and a conductive control gate on the inter-gaze dielectric, trenches formed in the substrate between and surrounding the individual pillars, under spaces between them, a first plurality of parallel gate conductors extending across the array in a first direction in contact with the control gates of the pillars over which they pass and extending into the spaces between floating gates of adjacent pillars in the first direction, and a second plurality of parallel gate conductors extending across the array in a second direction, the first and second directions being orthogonal with each other, the second gate conductors being insulated from the first gate conductors and extending into the spaces between floating gates of adjacent pillars and coupled with select gates of transistors positioned in trenches between at least some of the pillars in the second direction.

6. The array of claim 5, additionally comprising source and drain ion implants in the substrate trenches between others than said at least some of the pillars in the second direction.

7. The array of claim 6, additionally comprising a plurality of parallel bit line conductors extending across the array within the trenches in the first direction in contact with the source and drain ion implants.

8. The array of claim 6, wherein a path is provided within the substrate for programming electrons to accelerate upward adjacent side walls of trenches not containing one of the source and drain ion implants and into the floating gates positioned between the trenches.

9. The array of claim 6, wherein the source and drain ion implants are elongated in the first direction past a plurality of the pillars.

10. The array of claim 9, additionally comprising a plurality of parallel bit line conductors extending across the array within the trenches in the first direction in contact with the elongated source and drain ion implants.

11. The array of claim 5, wherein the select gates are formed integrally with the second gate conductors.

12. The array of claim 5, wherein the select gates are coupled with the second gate conductors through a layer of tunnel dielectric sandwiched between them.

13. The array of claim 5, wherein the inter-gate dielectric includes a layer of silicon nitride surrounded on both sides by layers of silicon dioxide.

14. The array of claim 5, wherein the pillars have their sidewalls oriented perpendicularly with the substrate surface.

15. The array of claim 5, wherein the trenches have depths within a range of 400 to 800 nanometers.

16. The array of claim 5, additionally comprising dielectric within the trenches between the select gates and bottoms of the trenches that is thicker than dielectric between the second plurality of gate conductors and edges of the floating gates.

17. An array of erasable re-programmable non-volatile memory cells formed across at least a portion of a semiconductor substrate, comprising:

a two-dimensional array of pillars that are rectangularly shaped in plan view across the substrate and which are individually formed of elements with their four edges self-aligned with one another including a gate dielectric layer on a surface of the substrate, a conductive floating gate on the gate dielectric, an inter-gate dielectric layer on the floating gate and a conductive control gate on the inter-gate dielectric, trenches formed in the substrate between and surrounding the individual pillars, under spaces between them, a first plurality of parallel gate conductors extending across the array in a first direction in contact with the control gates of the pillars over which they pass and extending into the spaces between floating gates of adjacent pillars in the first direction, and a second plurality of parallel gate conductors extending across the array in a second direction, the first and second directions being orthogonal with each other, the second gate conductors being insulated from the first gate conductors and extending into the spaces between floating gates of adjacent pillars in the second direction, source and drain ion implants in the substrate between adjacent pillars at the bottom of a first set of alternate trenches extending across the array in the second direction, and select transistors including select gates positioned between adjacent pillars and within a second set of alternate trenches extending across the second direction, the first and second sets of alternate trenches being distinct from each other, the select gates being coupled with the portion of the second gate conductors extending into the spaces between adjacent pillars, thereby providing an array of memory cells that individually include two source and drain ion implants and a select transistor therebetween in the second direction.

18. The array of claim 17, additionally comprising a plurality of parallel bit line conductors extending across the array within the trenches in the first direction in contact with the source and drain ion implants.

19. The array of claim 17, wherein the source and drain ion implants are elongated in the first direction past a plurality of the pillars.

20. The array of claim 19, additionally comprising a plurality of parallel bit line conductors extending across the array within the trenches in the first direction in contact with the elongated source and drain ion implants.

21. The array of claim 17, wherein the select gates are formed integrally with the second gate conductors.

22. The array of claim 17, wherein the select gates are coupled with the second gate conductors through a layer of tunnel dielectric sandwiched between them.

23. An array of erasable re-programmable non-volatile memory cells formed across at least a portion of a semiconductor substrate, comprising:

a rectangular array of charge storage elements formed across a surface of the substrate, trenches formed into the substrate between at least some of the charge storage elements, elongated control gates extending across charge storage elements and having portions extending down between them, and select transistor gates positioned within at least some of the trenches and coupled with the downward extending control gate portions through a layer of tunnel dielectric sandwiched between them, wherein the layer of tunnel dielectric has a thickness within a range of 0.5–4 nm.

24. An array of erasable re-programmable non-volatile memory cells formed across at least a portion of a semiconductor substrate, comprises:

a rectangular array of charge storage elements formed across a surface of the substrate, trenches formed into the substrate between at least some of the charge storage elements, elongated control gates extending across charge storage elements and having portions extending down between them, select transistor gates positioned within at least some of the trenches and coupled with the downward extending control gate portions through a layer of tunnel dielectric sandwiched between them, and layers of dielectric between the select transistor gates and bottoms of the trenches that are thicker than layers of dielectric between the control gates and the charge storage elements.

* * * * *